United States Patent
Lai et al.

(10) Patent No.: US 11,817,489 B2
(45) Date of Patent: Nov. 14, 2023

(54) NEGATIVE-CAPACITANCE AND FERROELECTRIC FIELD-EFFECT TRANSISTOR (NCFET AND FE-FET) DEVICES

(71) Applicant: Taiwan Semiconductor Manufacturing Co., Ltd., Hsinchu (TW)

(72) Inventors: Te-Yang Lai, Hsinchu (TW); Chun-Yen Peng, Hsinchu (TW); Chih-Yu Chang, Hsinchu (TW); Bo-Feng Young, Hsinchu (TW); Sai-Hooi Yeong, Zhubei (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/521,344

(22) Filed: Nov. 8, 2021

(65) Prior Publication Data
US 2022/0059671 A1    Feb. 24, 2022

Related U.S. Application Data

(62) Division of application No. 16/825,750, filed on Mar. 20, 2020, now Pat. No. 11,171,219.

(51) Int. Cl.
*H01L 29/51*    (2006.01)
*H01L 21/28*    (2006.01)
(Continued)

(52) U.S. Cl.
CPC ...... *H01L 29/516* (2013.01); *H01L 21/28185* (2013.01); *H01L 21/823821* (2013.01);
(Continued)

(58) Field of Classification Search
CPC .............. H01L 29/516; H01L 29/6684; H01L 29/78391
See application file for complete search history.

(56) References Cited

U.S. PATENT DOCUMENTS

2009/0261395 A1* 10/2009 Boescke ........... H01L 21/02194
257/295
2017/0103988 A1* 4/2017 Nishida ............... H01L 29/6684
(Continued)

OTHER PUBLICATIONS

Starschich et al, "An extensive study of the influence of dopants on the ferroelectric properties of HfO2", J. Mater. Chem. C, 2017, 5, 333-338. (Year: 2017).*

(Continued)

*Primary Examiner* — Julia Slutsker
(74) *Attorney, Agent, or Firm* — Slater Matsil, LLP

(57) ABSTRACT

Negative capacitance field-effect transistor (NCFET) and ferroelectric field-effect transistor (FE-FET) devices and methods of forming are provided. The gate dielectric stack includes a ferroelectric gate dielectric layer. An amorphous high-k dielectric layer and a dopant-source layer are deposited sequentially followed by a post-deposition anneal (PDA). The PDA converts the amorphous high-k layer to a polycrystalline high-k film with crystalline grains stabilized by the dopants in a crystal phase in which the high-k dielectric is a ferroelectric high-k dielectric. After the PDA, the remnant dopant-source layer may be removed. A gate electrode is formed over remnant dopant-source layer (if present) and the polycrystalline high-k film.

20 Claims, 21 Drawing Sheets

(51) Int. Cl.
  *H01L 29/423* (2006.01)
  *H01L 29/78* (2006.01)
  *H01L 29/66* (2006.01)
  *H01L 21/8238* (2006.01)
  *H01L 21/762* (2006.01)
  *H01L 21/3105* (2006.01)
  *H01L 21/311* (2006.01)
  *H01L 21/266* (2006.01)

(52) U.S. Cl.
  CPC ............ *H01L 21/823857* (2013.01); *H01L 29/42364* (2013.01); *H01L 29/517* (2013.01); *H01L 29/6684* (2013.01); *H01L 29/78391* (2014.09); *H01L 21/266* (2013.01); *H01L 21/31053* (2013.01); *H01L 21/31111* (2013.01); *H01L 21/76224* (2013.01); *H01L 21/823878* (2013.01); *H01L 29/66545* (2013.01)

(56) References Cited

U.S. PATENT DOCUMENTS

| | | | |
|---|---|---|---|
| 2018/0240803 A1* | 8/2018 | Yoo | H01L 29/517 |
| 2019/0057860 A1 | 2/2019 | Yoon et al. | |
| 2019/0067488 A1 | 2/2019 | Tsai et al. | |
| 2019/0164846 A1* | 5/2019 | Leib | H10B 10/12 |
| 2019/0244973 A1* | 8/2019 | Yoo | H01L 29/40111 |
| 2020/0013898 A1* | 1/2020 | Yim | H01L 21/823857 |
| 2020/0020762 A1* | 1/2020 | Frank | H01L 21/02356 |

OTHER PUBLICATIONS

Lederer et al., "Local crystallographic phase detection and texture mapping in ferroelectric Zr doped HfO2 films by transmission-EBSD." Appl. Phys. Lett. 115, 222902 (2019). (Year: 2019).*

* cited by examiner

NEGATIVE-CAPACITANCE AND FERROELECTRIC FIELD-EFFECT TRANSISTOR (NCFET AND FE-FET) DEVICES

PRIORITY CLAIM AND CROSS-REFERENCE

This application is a divisional of U.S. application Ser. No. 16/825,750, filed on Mar. 20, 2020, entitled "Negative-Capacitance and Ferroelectric Field-Effect Transistor (NCFET and FE-FET) Devices," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
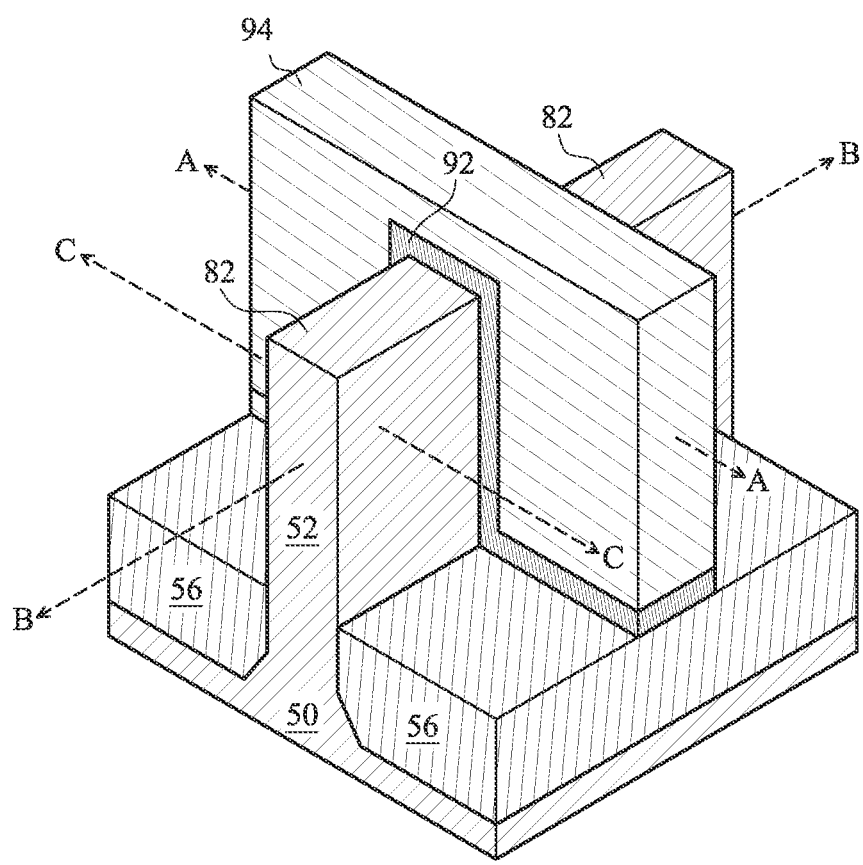
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure several embodiments of negative-capacitance, field-effect transistor (NCFET) and ferroelectric field effect transistor FE-FET devices, and methods to fabricate the NCFET and FE-FET devices in an integrated circuit have been described. The NCFET and FE-FET devices described herein utilize a gate dielectric stack comprising a ferroelectric dielectric layer in combination with other non-ferroelectric dielectric layers (e.g., an interfacial layer). As described in greater detail below, the embodiments comprise methods to form a dielectric layer and dope the dielectric layer to form a ferroelectric dielectric layer with stable ferroelectric properties that may be customized by adjusting the fabrication process conditions. The ferroelectric layer provides a layer having a negative capacitance $C_{fe}$ that when combined with the capacitance of the other dielectric layers provides a high capacitance of the combined dielectric stack. Such a dielectric stack may provide certain advantages when used in a device, for example, used as a gate dielectric layer of a transistor.

An advantage of the structures and methods such as those described herein is that the fabrication process may be adjusted to tailor the negative capacitance $C_{fe}$ of the ferroelectric dielectric layer to meet the $I_d$ vs. $V_g$ specifications for the NCFET and FE-FET, where $I_d$ refers to the drain current and $V_g$ refers to the gate voltage of the transistor. The embodiments of NCFETs described in this disclosure are in the context of FinFETs, which are three-dimensional (3D) MOSFETs built on fin-shaped semiconductor strips. However, it is understood that aspects of this invention may be applied to other 3D structures (e.g. gate-all-around (GAA) MOSFETs) or planar structures.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 14H, and 15A through 16B are cross-sectional views of intermediate stages in the manufacturing of NCFET and FE-FET FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 14F, 15A, and 16A are illustrated along reference cross-section A-A illustrated in FIG. 1, and FIGS. 8B, 9B, 10B, 11B, 12B, 13B, 14B-14E, 14G, 14H, 15B, and 16B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
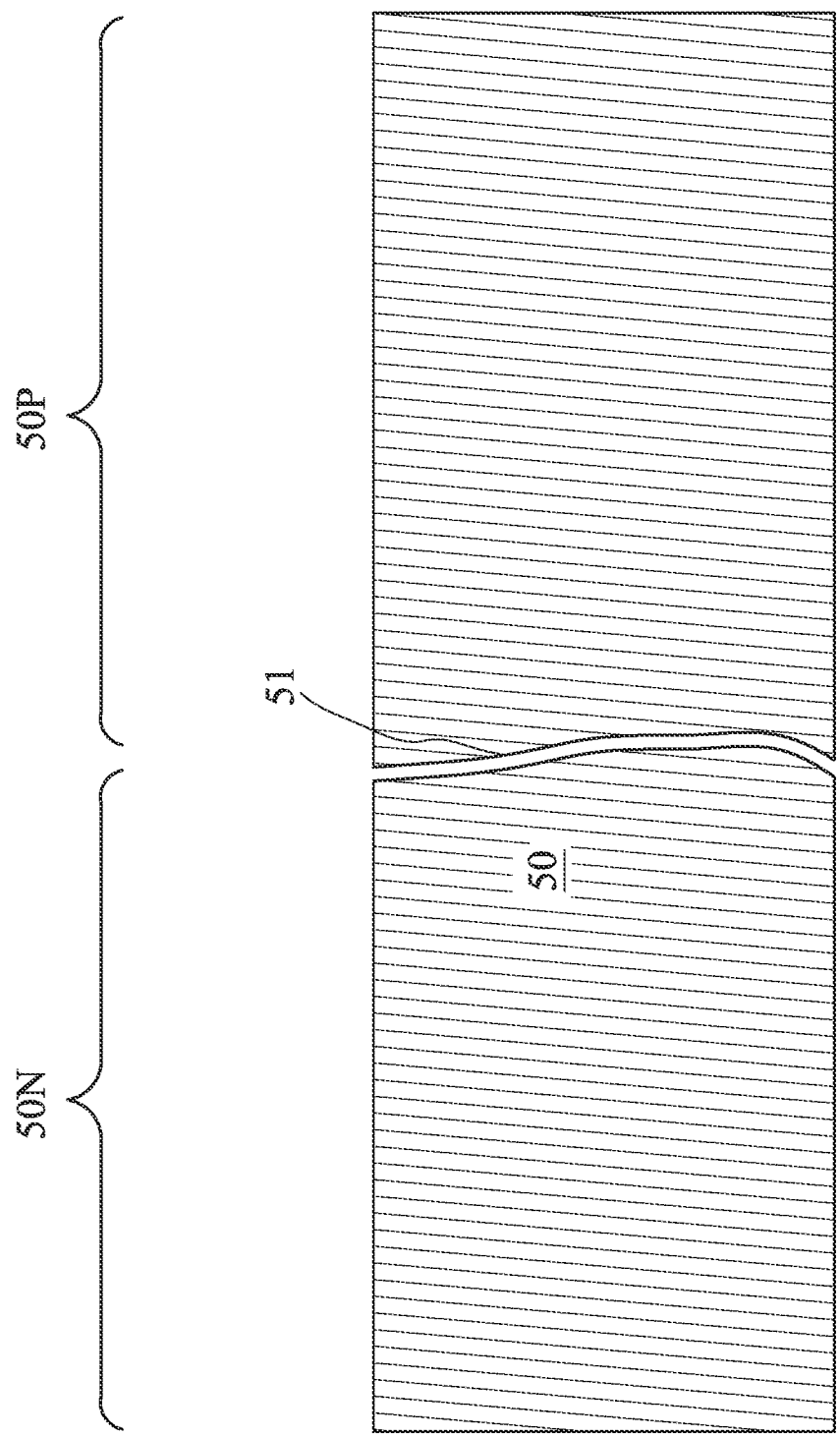
FIGS. 2 through 14H, and 15A through 16B are cross-sectional views of intermediate stages in the manufacturing of NCFET and FE-FET FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
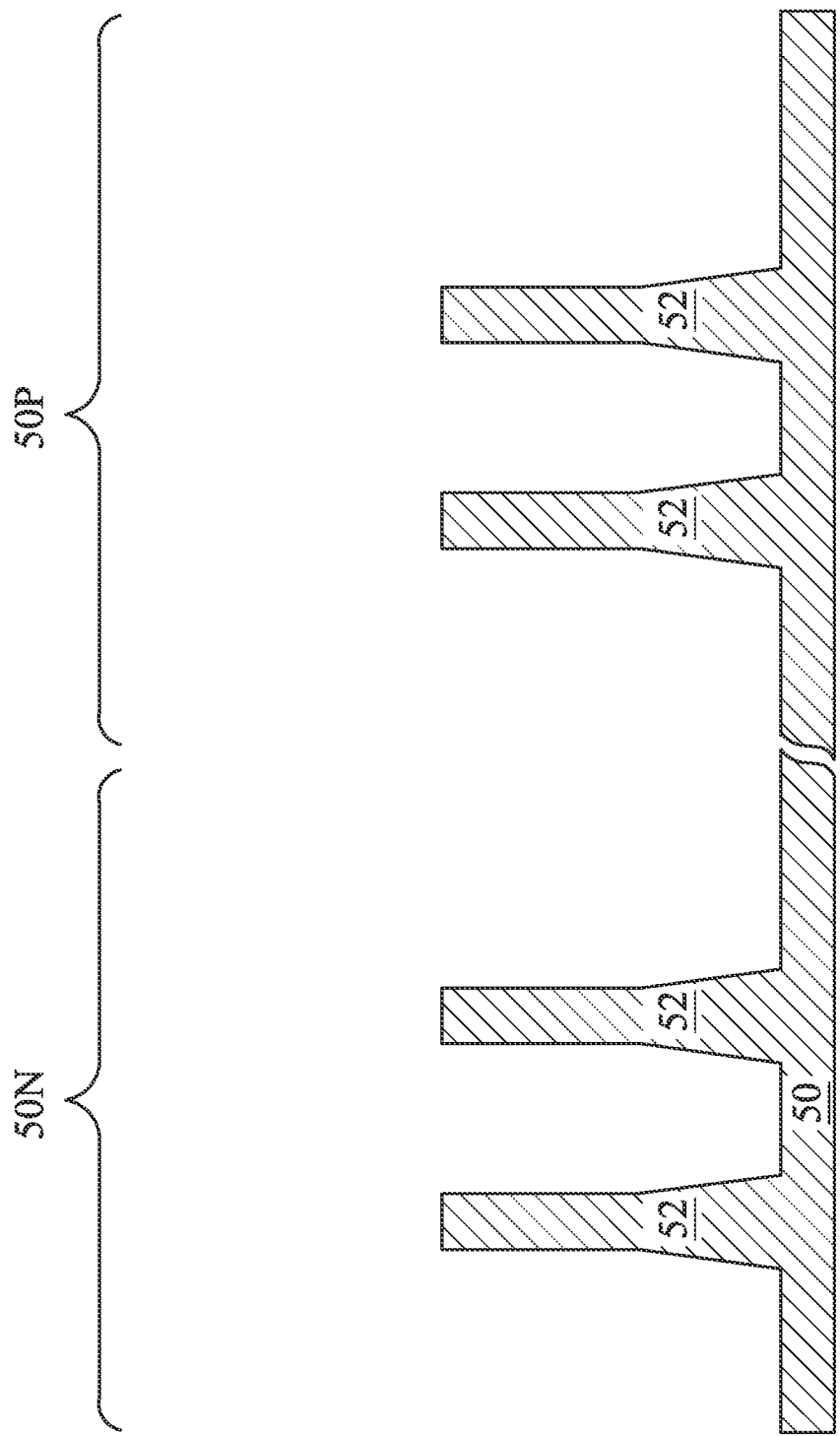

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to pattern the fins 52. In some embodiments, the mask may remain on the fins 52.

Figure 4:
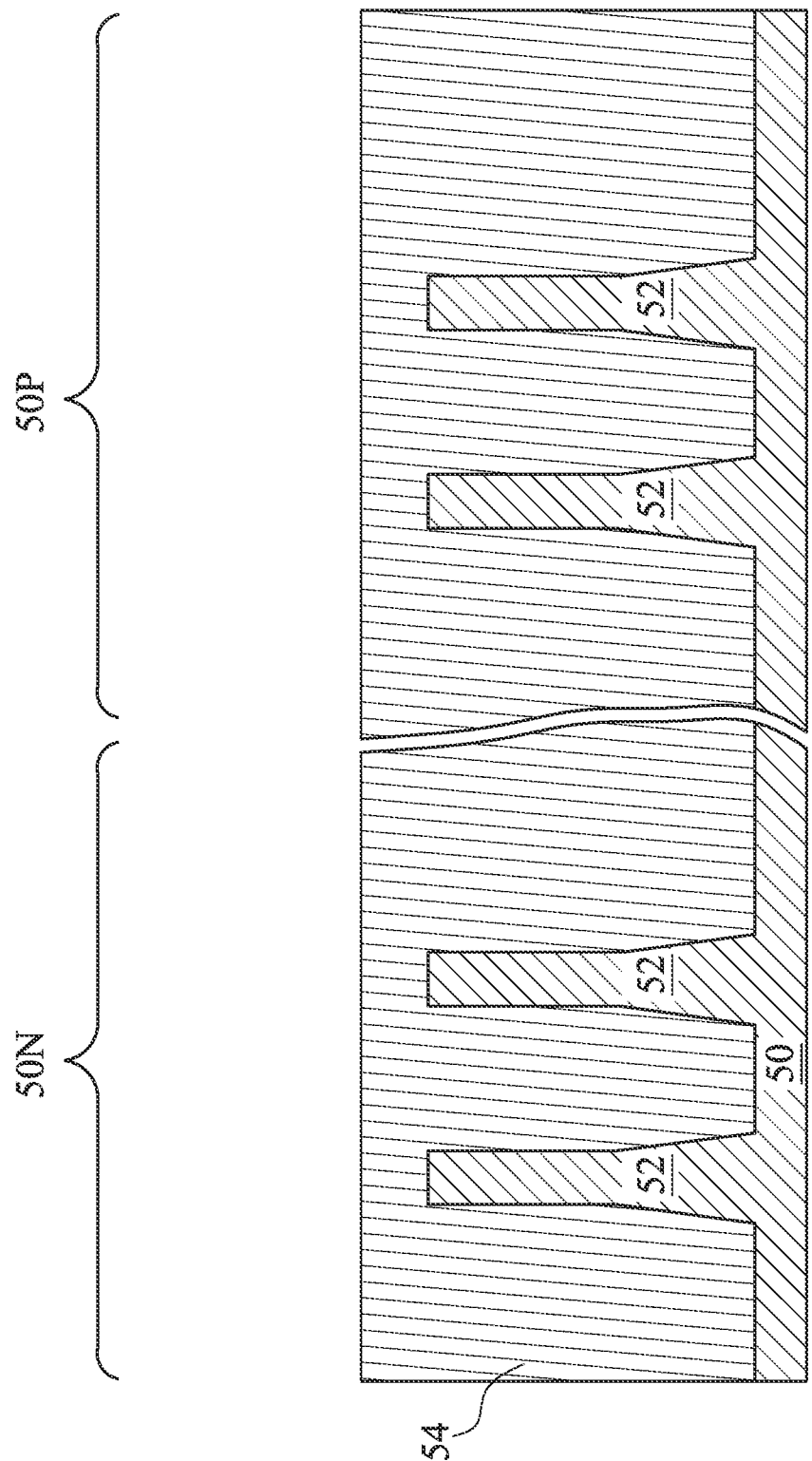

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
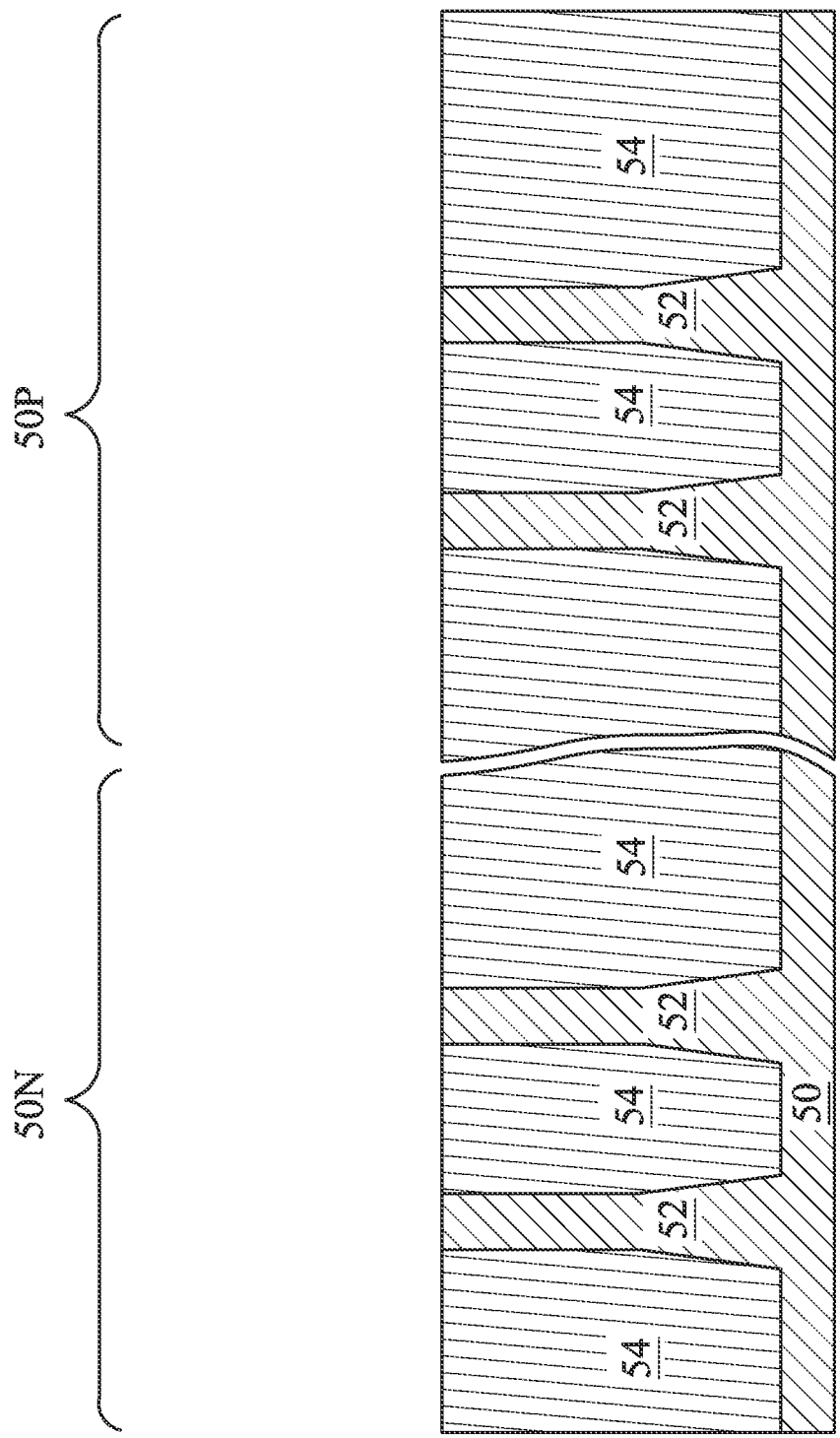

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
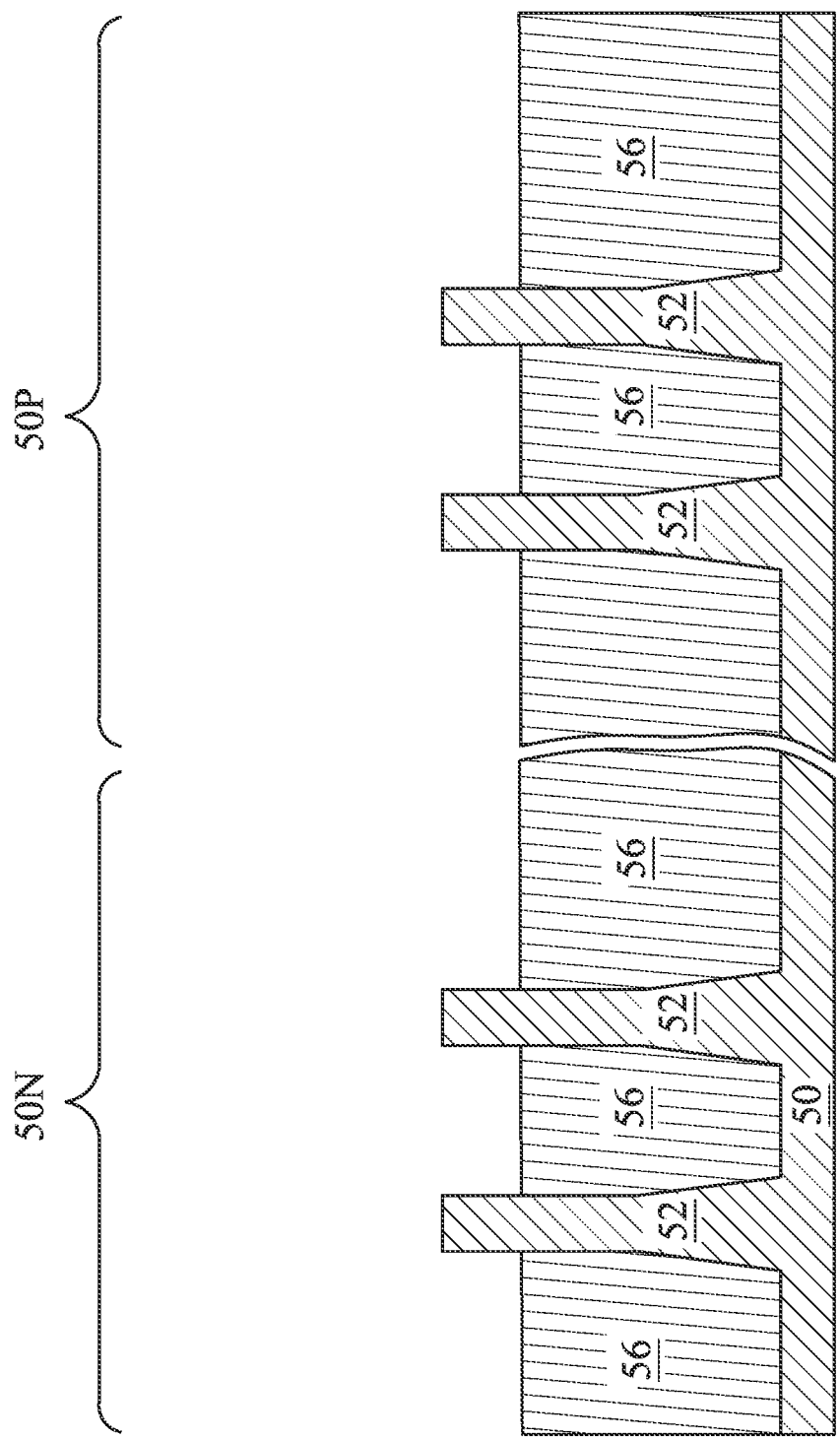

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
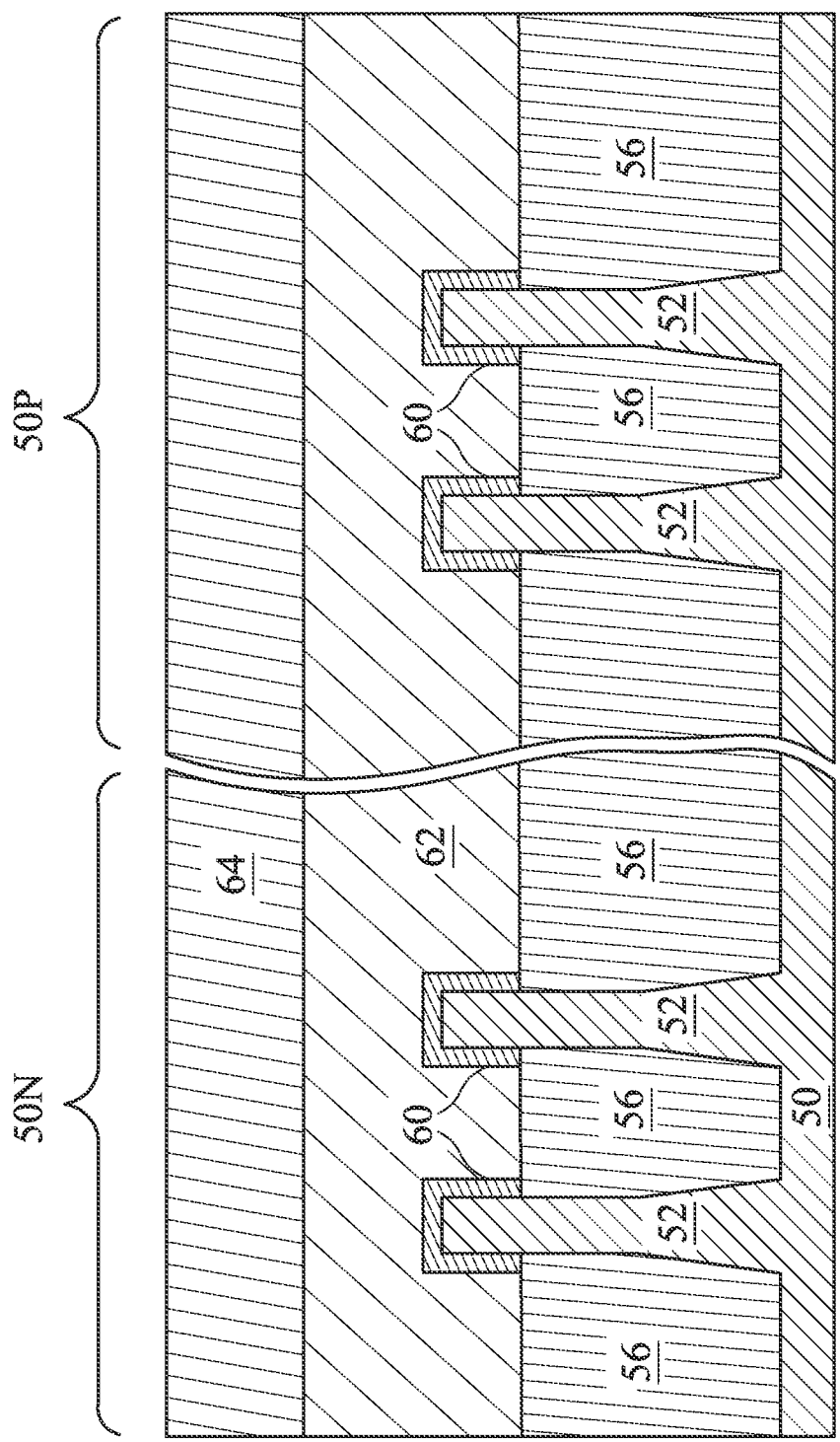

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material such as amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
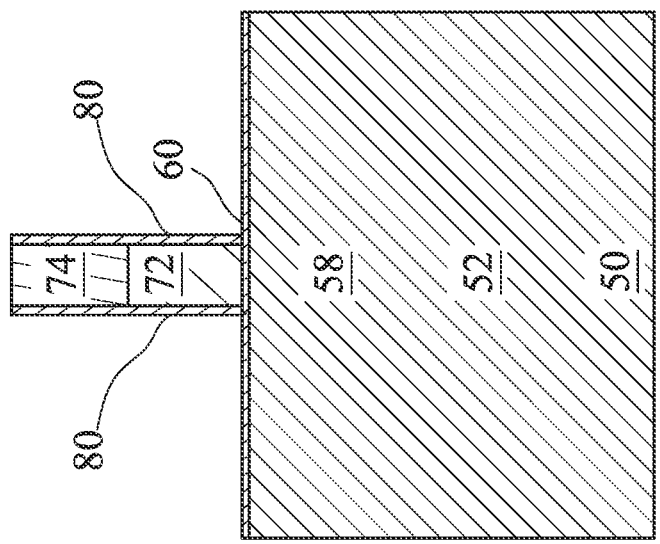
Figure 8A:
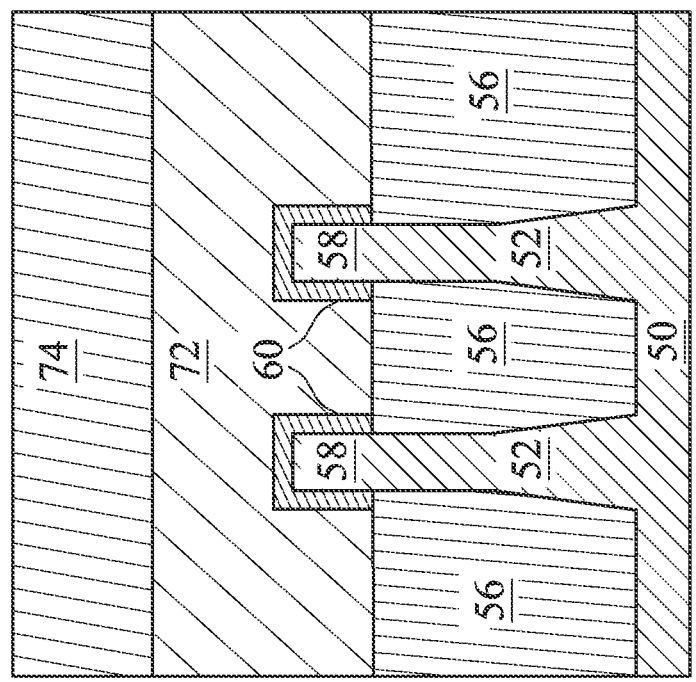

In FIGS. 8A and 8B, the mask layer 64 (see FIG. 7) may be patterned using acceptable photolithography and etching techniques to form masks 74. The pattern of the masks 74 then may be transferred to the dummy gate layer 62 to form the dummy gates 72. In some embodiments (not illustrated), the pattern of the masks 74 may also be transferred to the dummy dielectric layer 60. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of $SiO_2$, SiN, SiON, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{18}$ cm$^{-3}$. An anneal may be used to activate the implanted impurities.

Figure 9B:
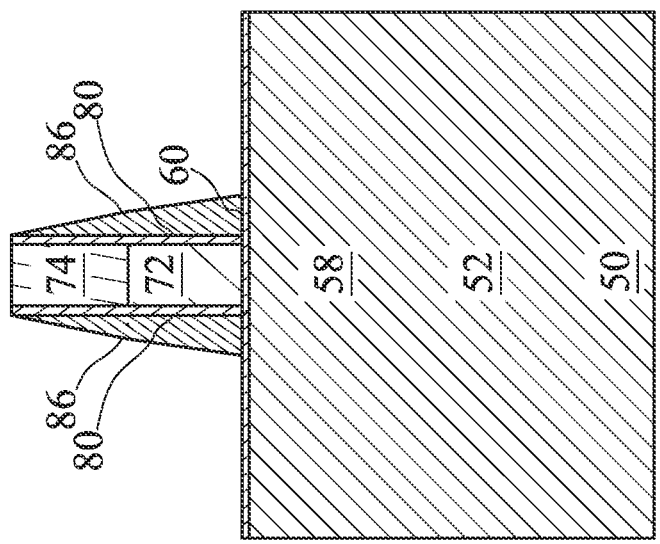
Figure 9A:
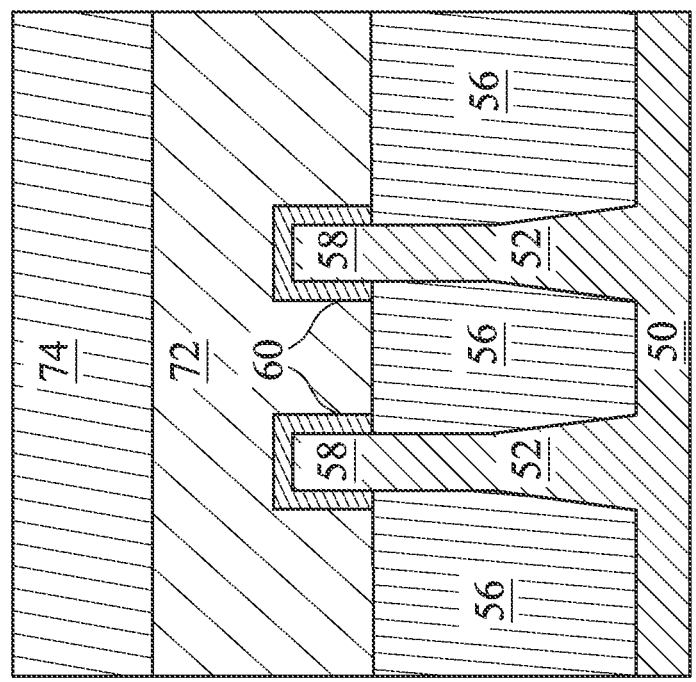

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, SiON, SiCN, a combination thereof, or the like.

Figure 10B:
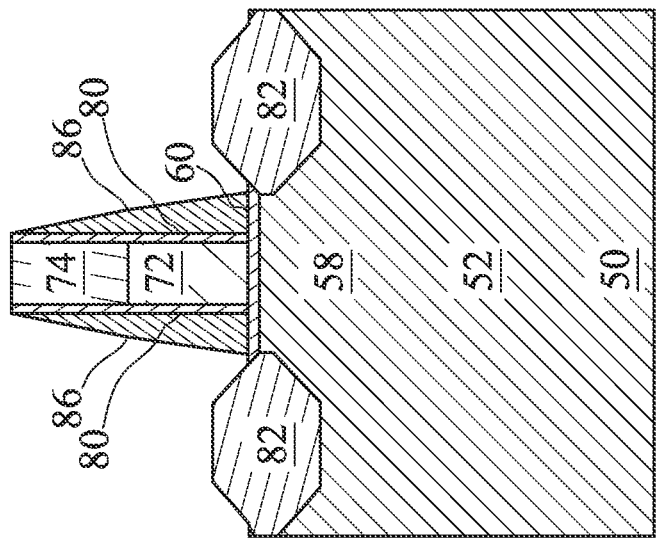
Figure 10A:
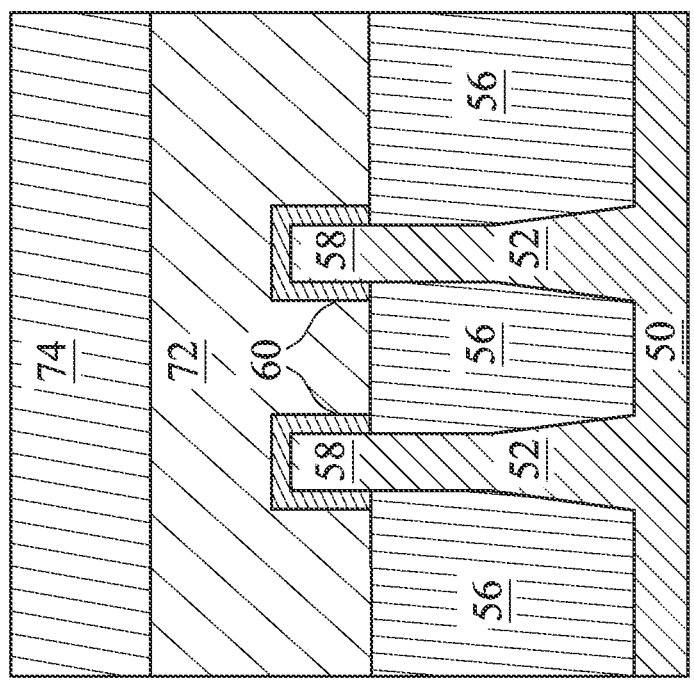
Figure 10C:
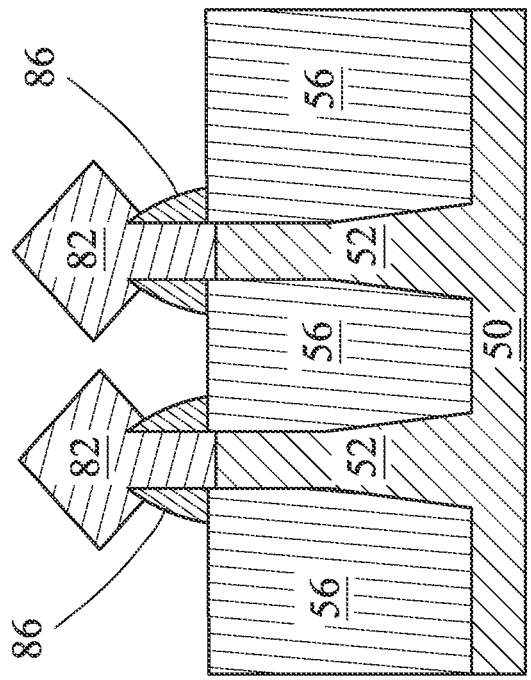
Figure 10D:
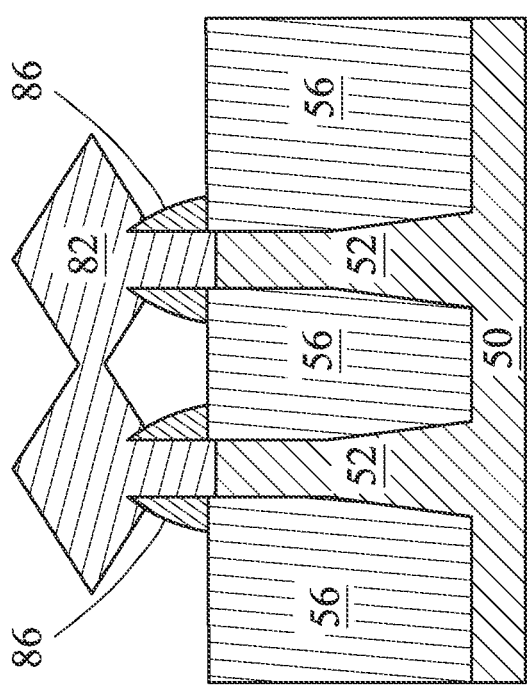

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
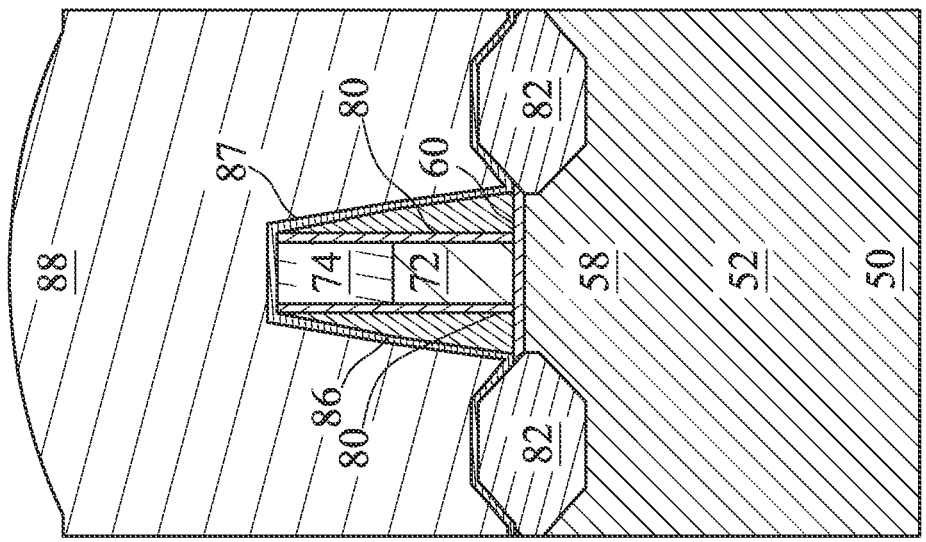
Figure 11A:
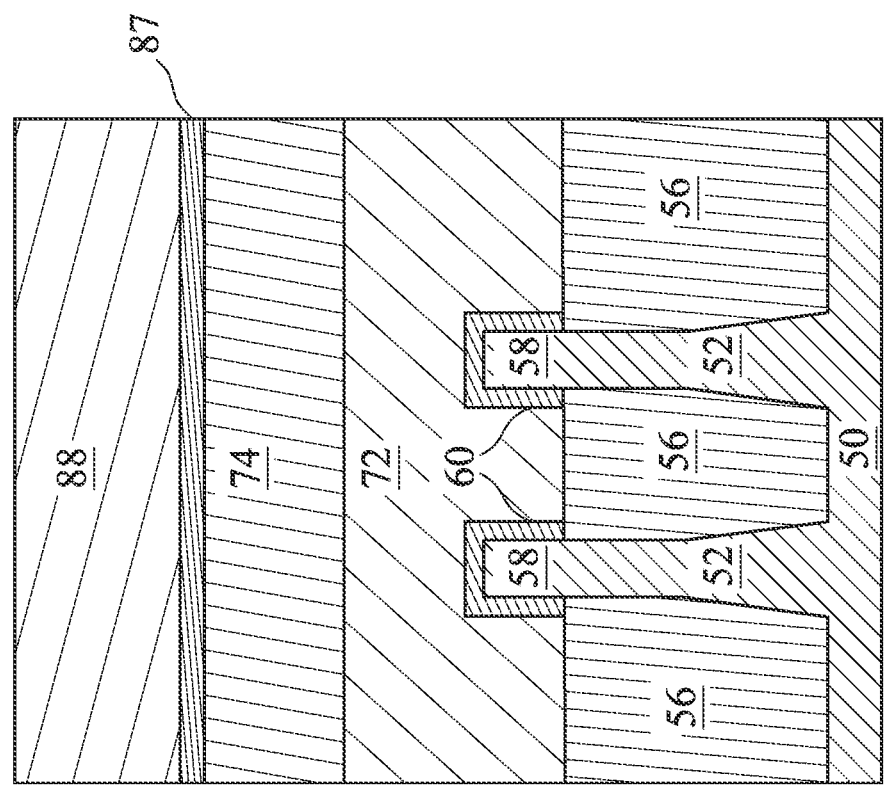

In FIGS. 11A and 11B, a first interlayer dielectric ILD 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 12B:
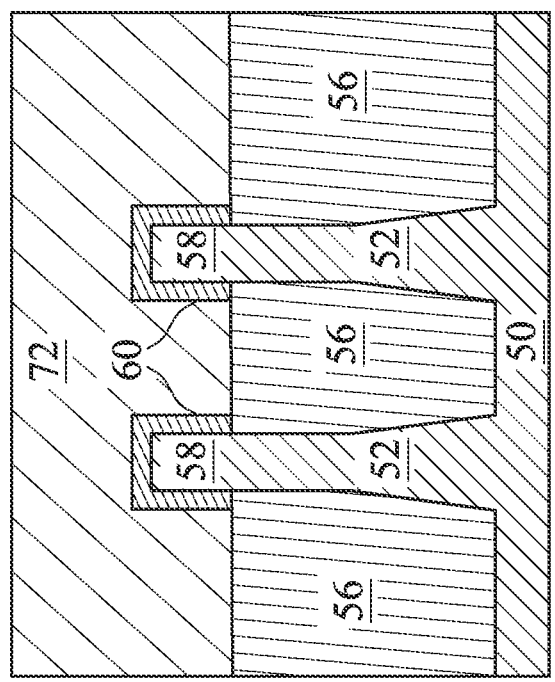
Figure 12A:
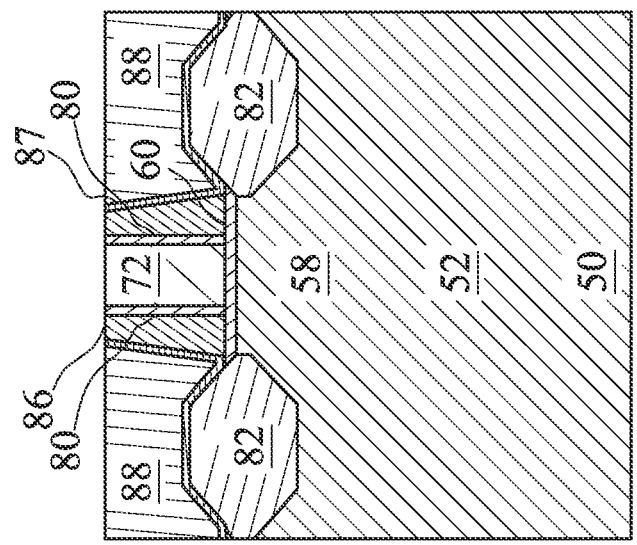

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
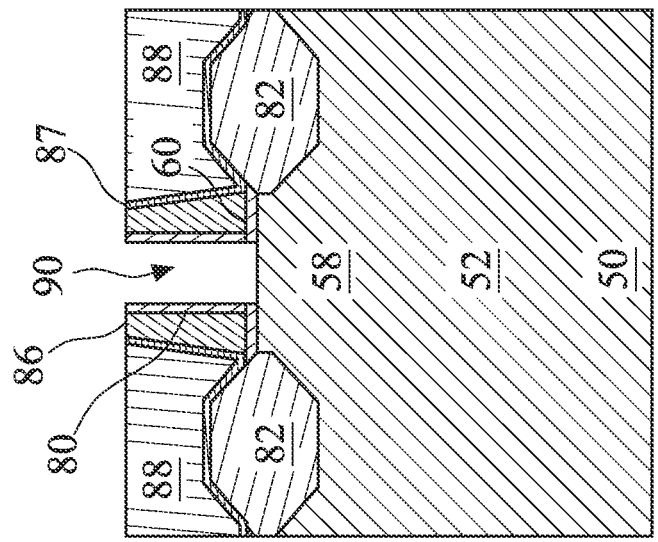
Figure 13A:
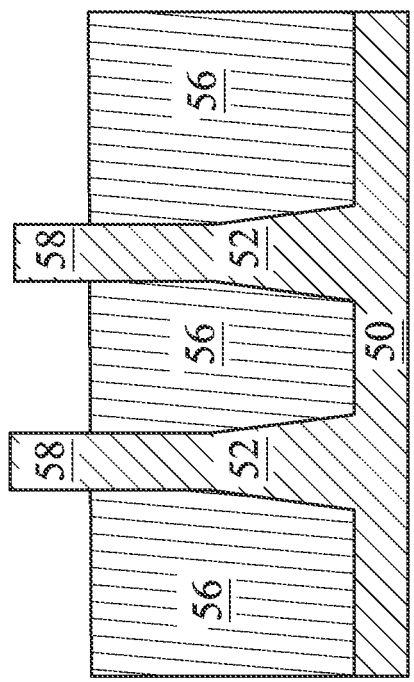

In FIGS. 13A and 13B, the dummy gate 72 (and the mask 74, if present) is removed in an etching step(s), so that recess 90 is formed. A wet chemical etch or a dry etch process (e.g., an anisotropic RIE) may be used. During the removal of the dummy gate 72, the dummy dielectric layer 60 may be used as an etch stop layer. In some embodiments, the etching process(es) may include etchants that selectively etch the dummy gate 72 (and the mask 74, if present) without significantly etching the first ILD 88, the CESL 87, or the gate spacers 86 and the gate-seal spacers 80. In some embodiments, such as the example illustrated in FIGS. 13A and 13B, a portion of the dummy dielectric layer 60 in the recess 90 is also removed using etchants that remove the dummy dielectric layer 60 at a higher etch rate than the channel region 58, the STI region 56, the first ILD 88, the gate spacers 86, and the gate-seal spacers 80. Removing a portion of the dummy dielectric layer 60 in the recess 90 exposes a channel region 58 of the respective fin 52. Each channel region 58 is disposed between neighboring pairs of the epitaxial source/drain regions 82.

It is understood that various structures, different from the example illustrated in FIGS. 13A and 13B, are possible. For example, in some other embodiments, only the dummy gates 72 may be removed and the dummy dielectric layer 60 remains and is exposed by the recesses 90. In some embodiments, the gate-seal spacers 80 may be removed along with the portion of the dummy dielectric layer 60.

FIGS. 14A through 14H illustrate the processing steps used to form the replacement gate layers (dielectric and conductive layers). The structure comprising the replacement gate dielectric and conductive layers is referred to as the final gate structure. The final gate structure of the NCFET FinFET described herein utilizes a gate dielectric stack comprising a non-ferroelectric gate dielectric layer and a ferroelectric gate dielectric layer formed over the channel regions 58. As explained above, a ferroelectric gate dielectric layer is included in the gate dielectric stack in order to generate a negative capacitance component that when combined with the capacitance $C_{nfe}$ of the non-ferroelectric gate dielectric layer helps increase the capacitance of the combined gate dielectric stack ($C_{ox}$) to realize a transistor with a high subthreshold slope (e.g., increase the $I_{ON}/I_{OFF}$ ratio of the transistor). The increase in $C_{ox}$ due to the negative capacitance component ($C_{fe}$) is understood from the following relationship: $1/C_{ox}=1/C_{nfe}-1/C_{fe}$, where $C_{fe}$ is the magnitude of the negative capacitance provided by the ferroelectric gate dielectric layer.

Figure 14B:
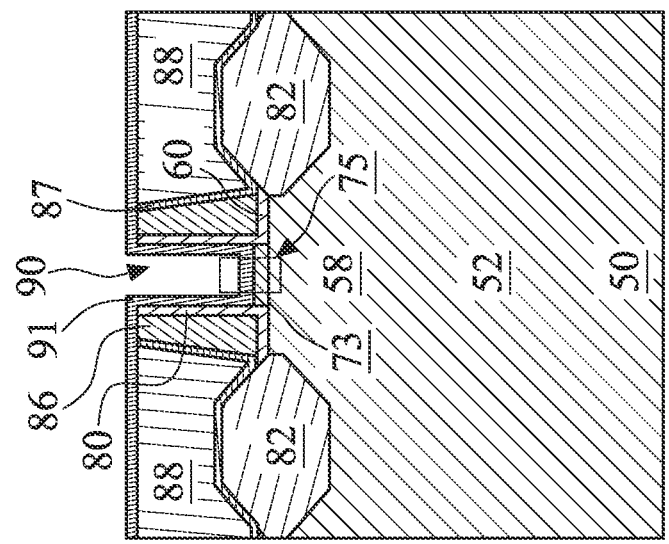
FIG. 14I is a graph showing the remanent polarization of ferroelectric gate dielectric layers of NCFET and FE-FET FinFETs, in accordance with some embodiments.
Figure 14A:
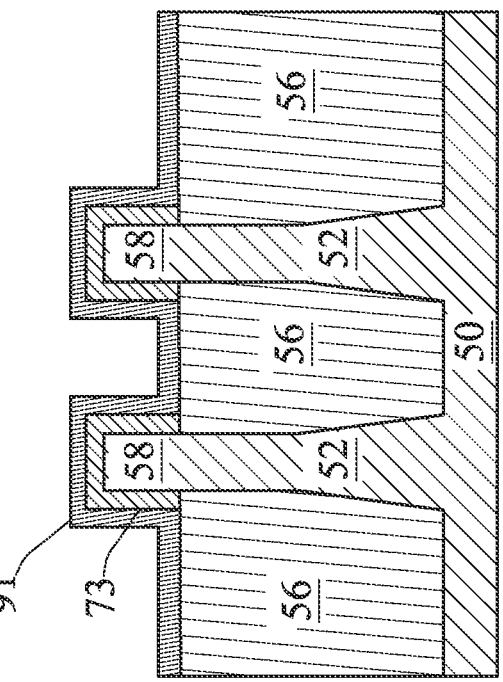

FIGS. 14A and 14B illustrate the replacement gate dielectric layers. Two dielectric layers are shown: an interfacial layer 73, which is the non-ferroelectric gate dielectric layer, and a ferroelectric gate dielectric layer 91. The ferroelectric gate dielectric layer 91 may be a high-k dielectric (e.g., a k value greater than that of silicon oxide), and in some embodiments, the ferroelectric gate dielectric layer 91 may have a dielectric constant k greater than about 7.0. As described in greater detail below, the processing used to form these layers may be adjusted to obtain the thicknesses and dielectric properties of the interfacial layer 73 and the ferroelectric gate dielectric layer 91 to provide the desired capacitance for the gate dielectric stack ($C_{ox}$) and $I_d$ vs. $V_g$ curves specified for a low standby power (low $I_{OFF}$) application.

The interfacial layer 73 in the embodiments illustrated in FIGS. 14A and 14B may be formed adjacent to the exposed surfaces (the sidewalls and the top surface) of the channel region 58 in recess 90 by chemically oxidizing the exposed semiconductor. Oxidizing the semiconductor of the channel region 58 exposed in the recess 90 may form a uniform oxide film over the exposed surface. In some embodiments, the semiconductor of the channel region 58 may be, for example, Si (or Ge) and the interfacial layer 73 may be, for example, $SiO_2$ (or $GeO_2$). In some embodiments, a thermal oxidation technique, such as, a rapid thermal oxidation (RTO) may be performed at a temperature from about 500° C. to about 1000° C. using dilute O2 at a concentration of 0.1% to 100% or $N_2O$.

In some embodiments, the exposed semiconductor (e.g. silicon) may be oxidized by a wet chemical method, such as immersing the wafer in dilute ozonated water ($DIO_3$) bath at a temperature from about 20° C. to about 60° C. The $O_3$ concentration may be between 1 ppm to 30 ppm. The oxidation conditions, for example, the temperature and/or the $O_2$ concentration used for the RTO process, or the bath temperature and/or the $O_3$ concentration for the $DIO_3$ process, may be adjusted to tune the thickness of the interfacial layer 73 from about 0.5 Å to about 2 nm. In some other embodiments (not shown), the interfacial layer 73 may be formed using techniques, for example, a CVD technique.

Also in FIGS. 14A and 14B, the ferroelectric gate dielectric layer 91 is shown conformally deposited, covering the top surfaces of the first ILD 88, the CESL 87, the gate spacers 86, and the gate-seal spacers 80 outside the recess 90. The ferroelectric gate dielectric layer 91 further extends inside the recess 90 over the sidewalls of the gate seal spacers 80, over the interfacial layer 73, and over the exposed surface of the STI region 56 outside the opposing sidewalls of the channel regions 58 of fins 52. In the embodiments described herein, the ferroelectric dielectric material utilized in the final gate structure is the orthorhombic-phase, doped polycrystalline $HfO_2$. The orthorhombic phase of $HfO_2$ is stabilized using dopants (e.g., Si, La, Zr, or the like, or combinations thereof) that may be introduced into the $HfO_2$ using, for example, a solid-source diffusion technique. The ferroelectric properties of the ferroelectric gate dielectric layer 91 may be tuned by adjusting the processing parameters of the solid-source diffusion process. In some embodiments, other dielectric materials such as $ZrO_2$ and $HfO_2$—$ZrO_2$ solid solution, and dopants such as Mg, Al, and Y may be used. Formation of the ferroelectric gate dielectric layer 91 is described in greater detail below with reference to a detailed view of the region 75 of FIG. 14B.

The gate dielectric layer of the final NCFET and FE-FET device comprises the interfacial layer 73 and the ferroelectric gate dielectric layer 91. In embodiments using the ferroelectric gate dielectric layer 91, the thickness of the interfacial layer 73 determines if the I-V and C-V characteristics of the final NCFET and FE-FET device are stable (e.g., hysteresis-free). If the interfacial layer 73 is less than 0.5 nm then the electrical characteristics may not be stable. If the interfacial layer 73 is greater than 2 nm then the total gate capacitance may be too low for the target transistor design.

Figure 14E:
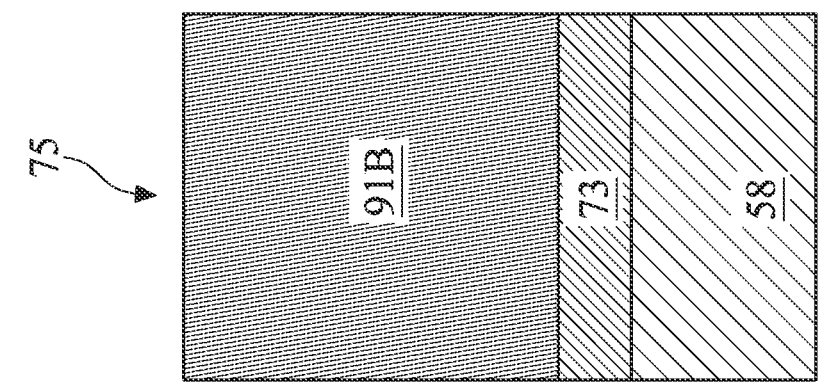
Figure 14D:
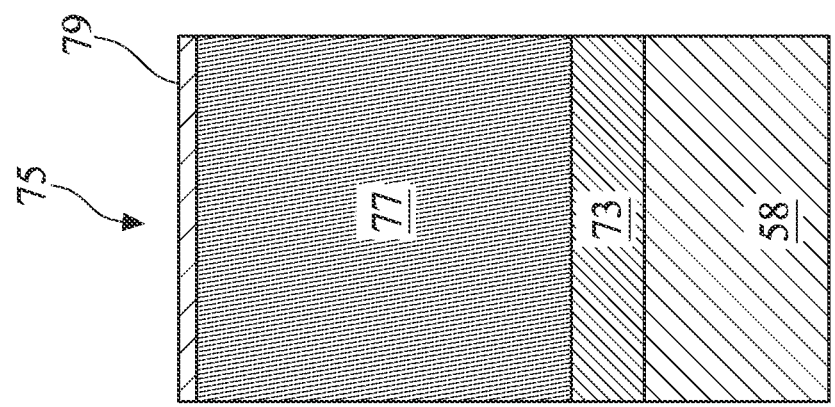
Figure 14C:
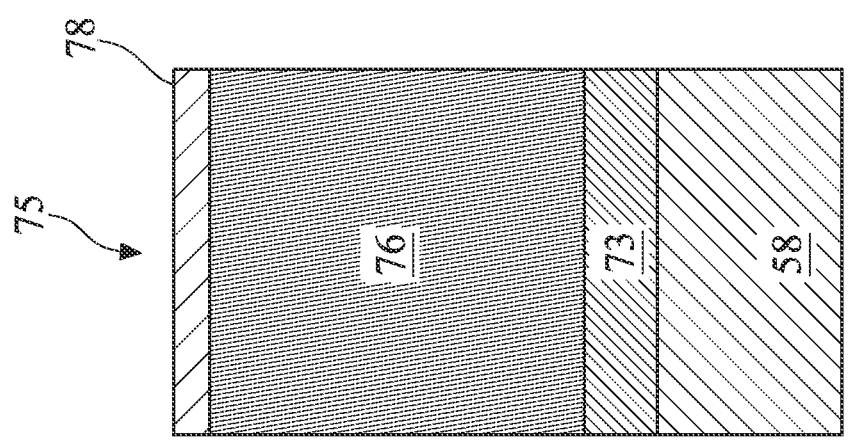

FIGS. 14C through 14E illustrate detailed cross-sectional views of the region 75 of FIG. 14B during several intermediate process steps used in the formation of the ferroelectric gate dielectric layer 91. Two embodiments for forming the ferroelectric gate dielectric layer 91 are described below and the respective ferroelectric gate dielectric layers are referred to as layers 91A and 91B in FIGS. 14D and 14E, respectively. The ferroelectric gate dielectric layers 91A and 91B may be collectively referred to as the ferroelectric gate dielectric layer 91. Referring first to FIG. 14C, a first high-k dielectric layer 76 (e.g., an amorphous $HfO_2$ layer) and a dopant-source layer 78 have been deposited successively over the interfacial layer 73 using, for example, CVD, ALD, plasma-enhanced ALD (PEALD), or the like, or a combination thereof. The dopant-source layer 78 may comprise a material such as $SiO_x$, $La_yO_x$, or $Zr_yO_x$ for a source of the dopants Si, La, and Zr, respectively, as examples. The thickness of the dopant-source layer 78 may be from about 0.5 Å to about 20 Å and the thickness of the first high-k dielectric layer 76 may be from 1 nm to about 10 nm.

In some embodiments, such as embodiments utilizing an ALD technique to form the first high-k dielectric layer 76 (e.g., an amorphous $HfO_2$ layer), a hydroxylated starting surface terminated with H atoms may be prepared. Each ALD reaction cycle comprises, for example, two reaction pulses with a purge performed after each reaction pulse. During the first reaction pulse, a first precursor gas such as $HfCl_4$ or a hafnium alkalymide, for example, tetrakis(ethyl-methylamido)hafnium $Hf(NMeEt)_4$ (TEMAH), tetrakis(di-methylamido)hafnium $Hf(NMe_2)_4$ (TDMAH), or tetrakis(diethylamido)hafnium $(Hf(NEt_2)_4)$ may be used as a source of the Hf atoms needed to form $HfO_2$. The Hf-source gas may be introduced into a reaction chamber at a flow rate of about 100 sccm to about 10000 sccm along with a carrier gas $N_2$, Ar and He at a flow rate of about 100 sccm to about 10000 sccm for a duration of about 0.1 s to about 6-s. The chamber may be at a pressure of about 1 Torr to about 10 Torr and a temperature of about 200° C. to about 400° C. A surface-gas reaction takes place whereby Hf from the precursor gas replaces the surface atoms, and the new surface is terminated with pairs of ligands from the precursor molecule (e.g., pairs of (NMeEt) if TEMAH is the precursor), each pair binding to one Hf atom.

A first purge pulse for about 0.1 s to about 60 s may be performed using, for example, a purge gas $N_2$, Ar, or He, at a flow rate of about 100 sccm to about 10000 sccm to remove by-products and excess Hf-source precursor gas from the chamber.

The first purge pulse is followed by the second reaction pulse of the ALD reaction cycle during which a second precursor gas such as $O_3$, $O_2$, $H_2O$, or $D_2O$ may be introduced into the reaction chamber to provide the 0 atoms needed to form $HfO_2$. In some embodiments, the O-source gas may be introduced at a flow rate of about 100 sccm to about 10000 sccm along with a carrier gas $N_2$, Ar, He at a flow rate of about 100 sccm to about 10000 sccm for a duration of about 0.1 s to about 60 s. The chamber may be at a pressure of about 1 Torr to about 10 Torr and a temperature of about 200° C. to about 400° C. The surface-gas reaction with the second precursor gas detaches the ligands at the surface from the Hf atom. In embodiments using $H_2O$ or $D_2O$, the free ligands binds with hydrogen (e.g., H(NMeEt) or D(NMeEt)) forming a gaseous by-product, and the OH (or OD) from the $H_2O$ (or $D_2O$) binds with Hf to generate a new hydroxylated surface terminated with H atoms. In embodiments using $O_3$, $O_2$, the detached ligands undergo further oxidation reactions to form final by-products such as $H_2O$, $CH_2O$, $CO_2$, NO, $NO_2$, etc. The OH from the by-product $H_2O$ may re-hydroxylate the surface. For example, in some embodiments, the second reaction pulse includes introducing $O_3$ at a flow rate of about 500 sccm to about 10000 sccm along with a carrier gas $N_2$ or Ar, for a duration of about 1 s to about 20 s. The chamber may be at a pressure of about 1 Torr to about 10 Torr and a temperature of about 200° C. to about 400° C. In this embodiment, $N_2$ or Ar may also be used as a purge gas.

A second purge pulse, such as that described above, may be performed to remove by-products and excess O-source gas from the reaction chamber.

The ALD reaction cycle described above, for example, a first reaction pulse using a first precursor gas (Hf-source gas), a first purge pulse, a second reaction pulse using a second precursor gas (O-source gas), and a second purge pulse, may be repeated any number of times to form a layer (e.g., an $HfO_2$ layer) having a desired thickness.

In some embodiments, a PEALD process may be used to form the first high-k dielectric layer 76 (e.g., an amorphous $HfO_2$ layer). For example, a first reaction pulse and a first purge pulse of the PEALD process may be performed similar to that described above for the thermal ALD process, and during the second reaction pulse of the PEALD reaction cycle the O-source precursor gas may be introduced with a direct plasma or remote plasma. The RF power may be about 10 W to about 2 kW at a frequency of about 10 kHz to about 20 MHz, and a DC bias of about 0 V to about 100 V may be used. The plasma may use $O_3$, $O_2$, $H_2O$, or $D_2O$ as the process gas introduced at a flow rate of about 100 sccm to about 10000 sccm along with a carrier gas Ar, He at a flow rate of about 100 sccm to about 10000 sccm for a duration of about 0.1 s to about 60 s. The chamber may be at a pressure of about 1000 mTorr to about 10000 mTorr. The reactivity of the oxidizing species is increased by the plasma so that the chamber temperature for the PEALD processes may be reduced relative to that for the thermal ALD process described above. For example, the range of temperature for the PEALD process may be from about 100° C. to about 400° C. In embodiments using PEALD, it may also be possible to use metal-organic Hf-precursors during the first reaction pulse, for example, HyALD $CpHf(NMe_2)_3$, where Cp denotes the cyclopentadienyl ring, because of the reduced temperatures.

The dopant-source layer 78 may also be formed using an ALD process. For example, the dopant-source layer 78 may be formed by utilizing an ALD reaction cycle where the first precursor gas may provide the dopant atoms of the dopant-source layer 78 (e.g., a Si-source gas, a La-source gas, or a Zr-source gas). The precursor for Si-dopant may be $SiCl_4$, $SiH_4$, $C_6H_{17}NSi$ (LTO520), $Si_2H_6$, or the like. The precursor for La-dopant may be $La(C_5H_5)_3$, $La(C_{11}H_{19}O_2)_3$ $(La(thd)_3)$, $C_{21}H_{45}LaN_6$ $(La(FMD)_3)$, or the like. The precursor for Zr-dopant may be $ZrCl_4$, $Zr(C_5H_5)(N(CH_3)_2)_3Zr$ $(NCH_3C_2H_5)_4$ (TEMAZ), $[(CH_3)_2N]_4Zr$ (TDMAZ), or the like. The first reaction pulse may be of duration 0.1 s to about 60 s during which a dopant-precursor gas may be introduced into a reaction chamber at a flow rate of about 100 sccm to about 10000 sccm along with a carrier gas N2, Ar, He at a flow rate of about 100 sccm to about 10000 sccm during a reaction pulse of duration 0.1 s to about 60 s. The chamber may be at a pressure of about 1 Torr to about 10 Torr and a temperature of about 200° C. to about 400° C.

The first reaction pulse of the ALD process may be followed by a purge pulse and the purge may be followed by a second reaction pulse during which a second precursor gas such as, $O_3$, $O_2$, $H_2O$, or $D_2O$, may be introduced into the reaction chamber to provide an O-source needed for a surface-gas reaction to form a monolayer of dopant-oxide. The second reaction pulse may be of duration 0.1 s to about 60 s during which the O-source gas may be introduced into a reaction chamber at a flow rate of about 100 sccm to about 10000 sccm along with a carrier gas $N_2$, Ar, He at a flow rate of about 100 sccm to about 10000 sccm during a reaction pulse duration of 0.1 s to about 60 s. After the second reaction pulse, another purge process may be performed to complete one reaction cycle, as discussed above.

In some embodiments, a PEALD process may be used to form the dopant-source layer 78. For example, a first reaction pulse and a first purge pulse of the PEALD process may be performed using gases and processing parameters similar to those described above for the thermal ALD process.

During the second reaction pulse of the PEALD reaction cycle the O-source precursor gas may be introduced with a direct plasma or remote plasma, in accordance with some embodiments. The RF power may be about 10 W to about 2 kW at a frequency of about 10 kHz to about 20 MHz, and a DC bias of about 0 V to about 100 V may be used. The plasma may use $O_3$, $O_2$, $H_2O$, or $D_2O$ as the process gas introduced at a flow rate of about 100 sccm to about 10000 sccm along with a carrier gas, such as Ar or He, at a flow rate of about 100 sccm to about 10000 sccm for a duration of about 0.1 s to about 60 s. The chamber may be at a pressure of about 1 Torr to about 10 Torr. The reactivity of the oxidizing species is increased by the plasma so that the chamber temperature for the PEALD processes may be reduced relative to that for the thermal ALD process described above. For example, the range of temperature for the PEALD process may be from about 100° C. to about 400° C.

In embodiments using PEALD, it may also be possible to use additional precursors for dopants (e.g., $H_2Si[N(C_2H_5)_2]_2$ (SAM24) for Si-dopant, $La(C_3H_7C_5H_4)_3(La(iPrCp)_3)$ for La-dopant, and (ZyALD) for Zr-dopant).

In some embodiments, more than one dopant species may be used. The thicknesses of the dopant-source layer 78 and the first dielectric layer 76 may be accurately controlled by controlling the number of ALD/PEALD reaction cycles performed during the formation of each respective layer.

In FIG. 14D a post-deposition anneal (PDA) is performed. In some embodiments, the PDA is performed in a $N_2$ ambient or a dilute oxygen ambient. In some embodiments, the PDA may be a rapid thermal anneal (RTA) at a temperature of about 500° C. to about 1000° C. for a soak time of about 5 s to about 10 min, or a spike anneal at a temperature of about 750° C. to about 1000° C. The PDA may be utilized to convert the as-deposited non-ferroelectric high-k dielectric layer 76 to a ferroelectric high-k dielectric layer 77. For example, an amorphous $HfO_2$ layer 76 may be converted by the PDA to an orthorhombic-phase, doped polycrystalline $HfO_2$, thereby forming the ferroelectric high-k dielectric layer 77, in accordance with some embodiments. Amorphous $HfO_2$ layer 76 is a non-ferroelectric high-k dielectric, whereas orthorhombic-phase, doped polycrystalline $HfO_2$ is a ferroelectric high-k dielectric. The naturally unstable orthorhombic phase of pure $HfO_2$ may be stabilized by incorporating dopant atoms (e.g., Si, La, Zr, or the like) in the dielectric. A portion of the dopants from the dopant-source layer 78 may diffuse and incorporate substitutionally into the $HfO_2$ as the amorphous $HfO_2$ crystallizes during the PDA, thereby forming a ferroelectric high-k dielectric layer 77. The final dopant concentration profile and the ferroelectric properties may be varied by varying the PDA processing parameters, for example, the thermal budget. In some embodiments, a ratio of the number of dopant atoms incorporated in the ferroelectric high-k dielectric layer 77 to the total number of atoms present in the ferroelectric high-k dielectric layer 77 may be about 0.5% to about 30% for Si dopants, about 0.5% to about 50% for La dopants, and about 5% to about 80% for Zr dopants to provide a stable ferroelectric high-k dielectric layer 77. A ratio of dopant atoms less than these amounts may be insufficient to stabilize the orthorhombic-phase, polycrystalline $HfO_2$, thereby reducing the ferroelectric properties of the $HfO_2$ material. A ratio of dopant atoms greater than these amounts may reduce the fraction of the polycrystalline $HfO_2$ material that is stabilized in the orthorhombic phase; thereby reduce a remanent polarization ($P_R$) of the ferroelectric gate dielectric layer 91. The reduced $P_R$ may result in an insufficient negative capacitance of magnitude $C_{fe}$.

The remaining portion of the dopant-source layer 78 is shown in FIG. 14D as a remnant dopant-source layer 79. The ratio of the thickness of the remnant dopant-source layer 79 to the thickness of the as-deposited dopant-source layer 78 may be from about 0.2 to about 0.8. The reduction in thickness due to the PDA (the difference between the thicknesses of the as-deposited dopant-source layer 78 and the remnant dopant-source layer 79) may vary from about 0.25 Å to about 10 Å. In some embodiments, the remnant dopant-source layer 79 is retained in the NCFET as a part of the ferroelectric gate dielectric layer 91A. The total thickness of the ferroelectric gate dielectric layer 91A (comprising the ferroelectric high-k dielectric layer 77 and the remnant dopant source layer 79) may be about 1 nm to about 12 nm. In other embodiments, as illustrated in FIG. 14E, the remnant dopant-source layer 79 may be removed using, for example an RCA wet clean process. The thickness of the ferroelectric gate dielectric layer 91B (same as the thickness of the ferroelectric high-k dielectric layer 77) may be about 1 nm to about 10 nm. If the thicknesses of the ferroelectric gate dielectric layer 91B (or the ferroelectric high-k dielectric layer 77) is less than 1 nm then the gate dielectric of the final NCFET and FE-FET device may have high leakage and/or low time-dependent dielectric breakdown (TDDB) lifetime. If the thickness of the ferroelectric gate dielectric layer 91B (or the ferroelectric high-k dielectric layer 77) is greater than 10 nm then the total gate capacitance may be too low for the target transistor design Removing the remnant dopant-source layer 79 alters the ferroelectric properties of the ferroelectric gate dielectric layer 91 in the final fabricated NCFET device, as discussed in greater detail below with reference to FIG. 14I.

Figure 14G:
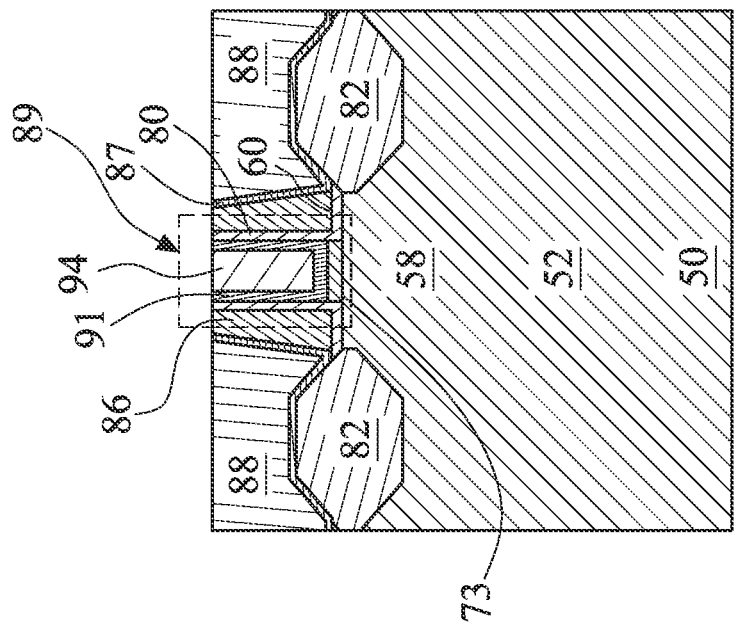
Figure 14F:
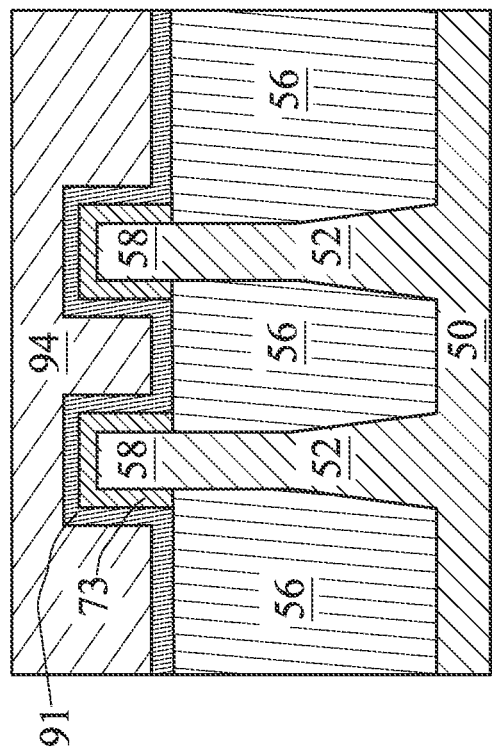

In FIGS. 14F and 14G further illustrate a gate electrode 94. The gate electrode 94 is deposited over the ferroelectric gate dielectric layer 91, and fills the remaining portion of the recess 90. After the gate recess 90 is filled, a planarization process, such as a CMP, may be performed to remove the excess portions of the ferroelectric gate dielectric layer 91 and the materials of the gate electrodes 94 from over the top surface of the ILD 88. FIGS. 14F and 14G, illustrate the gate structure after the planarization step is completed. FIG. 14G illustrates the inlaid gate electrode 94 between two gate seal spacers 80 in a cross-sectional image of a FinFET along a longitudinal axis of a fin 52 (the axis B-B shown in FIG. 1). FIG. 14F illustrates the gate structure over two fins 52 and STI regions 56 in a cross-sectional image of a FinFET along a longitudinal axis of a gate electrode 94 (the axis A-A shown in FIG. 1). In FIG. 14F, the gate structure comprising the interfacial layer 73, the ferroelectric gate dielectric layer 91, and gate electrodes 94 is shown extending over the top surface and along sidewalls of a channel region 58 of the fins 52. The ferroelectric gate dielectric layer 91 and the gate electrode 94 may extend further over the STI regions 56 outside the opposing sidewalls of the channel regions 58 of fins 52, in accordance with some embodiments.

Figure 14H:
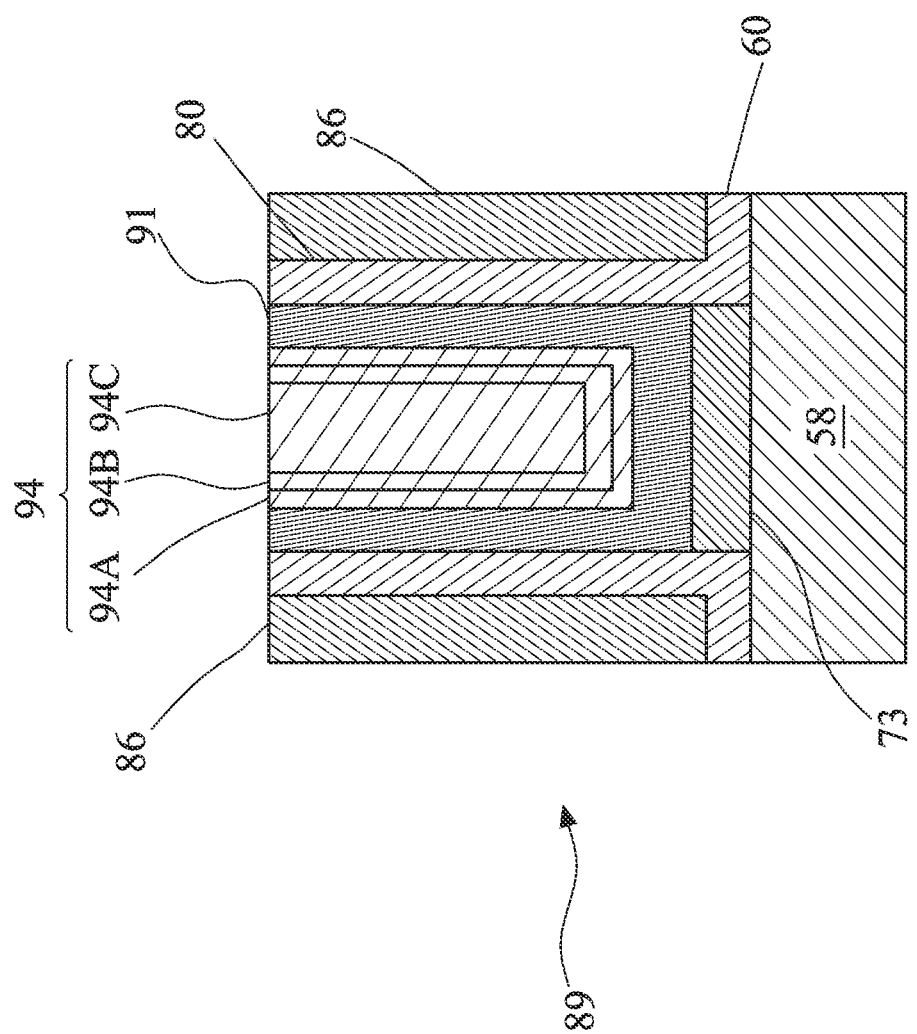

FIG. 14H illustrates a detailed view of region 89 of FIG. 14G. As illustrated in FIG. 14H, the gate electrode 94 may include a metal-containing material such as TiN, TiO, TaN, TaC, Co, Ru, Al, W, combinations thereof, or multi-layers thereof. For example, although a single layer gate electrode 94 is illustrated in FIG. 14G, the gate electrode 94 may comprise any number of cap layers (also known as liner layers) 94A, any number of work function tuning layers 94B, and a fill material 94C as illustrated by FIG. 14H. An optional post-cap anneal may be performed after depositing the cap layers 94A.

In some embodiments, the formation of the ferroelectric gate dielectric layers 91 in the region 50N and the region 50P may occur simultaneously such that the ferroelectric gate dielectric layer 91 in each region is formed from the same materials, but the gate electrode 94 may be formed by distinct processes, such that the gate electrode 94 may comprise different materials to accommodate different work functions required of the respective gate electrodes 94 of NMOS and PMOS transistors. In some embodiments, various other combinations of same/distinct processes may be used to form the ferroelectric gate dielectric layer 91 and/or the gate electrode 94 in each region. Various masking steps may be used to mask and expose appropriate regions when using distinct processes.

Figure 14I:
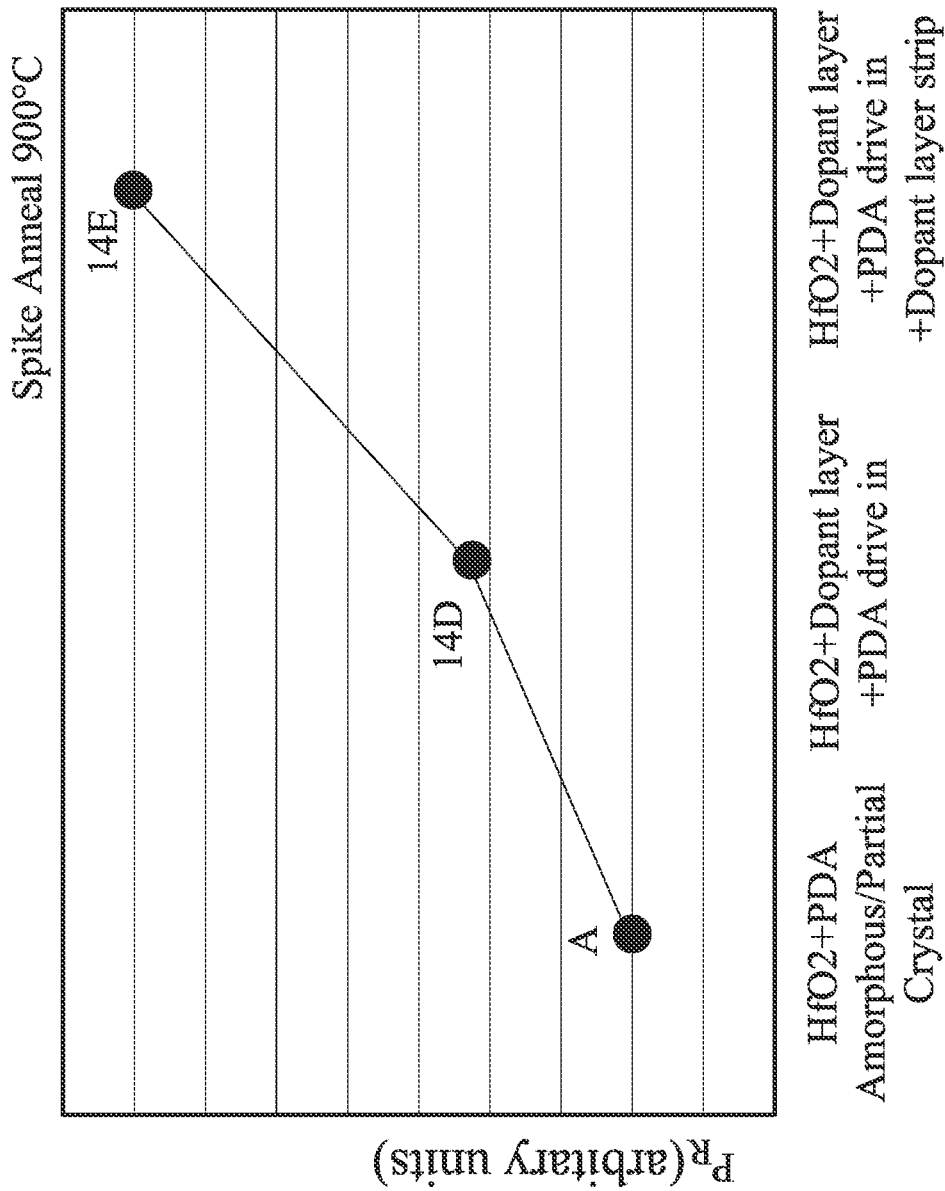

FIG. 14I illustrates the difference in ferroelectric properties achieved by either retaining (e.g., the embodiment in FIG. 14D) or removing (e.g., the embodiment in FIG. 14E) the remnant dopant-source layer 79. The ferroelectric property being compared in the chart in FIG. 14I is the remanent polarization ($P_R$) of the ferroelectric gate dielectric layer 91. Generally, the electric polarization (P) in a dielectric material is a function of the electric field (E). Ordinarily, P=0 at E=0, but in a ferroelectric dielectric layer, the P vs. E curve is nonlinear and has a hysteresis loop wherein P≠0 at E=0. The electric polarization at zero electric field is referred to as $P_R$. A reverse electric field, referred to as the coercive field ($E_C$), is applied to force P to zero. The polarity of $P_R$ (and $E_C$) on the increasing branch of the hysteresis is opposite to the respective polarity on the decreasing branch. This $P_R$ provides a negative capacitance and, hence, a steeper subthreshold slope and $I_{ON}/I_{OFF}$ ratio.

FIG. 14I illustrates the different values of $P_R$ corresponding to the two example embodiments illustrated in FIGS. 14D and 14E (labeled as 14D and 14E, respectively). In addition, a third value of $P_R$ (labeled as point A in FIG. 14I) is shown that corresponds to a $HfO_2$ layer without being doped with the dopant-source layer 78. In the samples used for the results shown in FIG. 14I, the dopant La from a $La_2O_3$ dopant-source layer 78 has been used to stabilize the orthorhombic phase of the polycrystalline $HfO_2$ to form the ferroelectric high-k dielectric layer 77 using a 900° C. spike PDA process. As shown in FIG. 14I, including dopants in $HfO_2$ layer increases the $P_R$ of the ferroelectric gate dielectric layer 91, which in turn provides a steeper subthreshold slope and $I_{ON}/I_{OFF}$ ratio, as stated above. The results illustrated in FIG. 14I further indicate that performing/omitting the removal process of the remnant dopant-source layer 79 in the final NCFET device may additionally (in addition to the processing parameters of the PDA process) be used to adjust the ferroelectric properties (e.g., $P_R$ and $E_C$) of the ferroelectric gate dielectric layer 91. For example, the middle point (labeled as 14D) corresponds to the $P_R$ value for the embodiment illustrated in FIG. 14D in which the ferroelectric gate dielectric 91 includes the remnant dopant-source layer 79. As illustrated, the $P_R$ increases in the sample labeled as 14E, which corresponds to the embodiment illustrated in FIG. 14E wherein the remnant dopant-source layer 79 is removed. In some embodiments, $P_R$ of the ferroelectric gate dielectric layer 91 in the final NCFET device may be made 100% to 300% larger by performing the removal process of the remnant dopant-source layer 79.

As illustrated in FIG. 14I, embodiments such as those illustrated in FIG. 14E may exhibit a higher $P_R$ relative to embodiments such as those illustrated in FIG. 14D, thereby providing a higher a negative capacitance and, hence, a steeper subthreshold slope and $I_{ON}/I_{OFF}$ ratio. The additional control over the ferroelectric properties (e.g., $P_R$ of the ferroelectric gate dielectric layer 91) may be advantageous in designing for stable NCFETs with improved turn-off characteristics, as described above. In some embodiments, $P_R$ of the ferroelectric gate dielectric layer 91 in the final NCFET device may be varied from about 0.5 µC/cm² to about 30 µC/cm² by adjusting the PDA processing conditions and by selecting or bypassing the post-PDA dopant-source layer removal step.

Figure 15B:
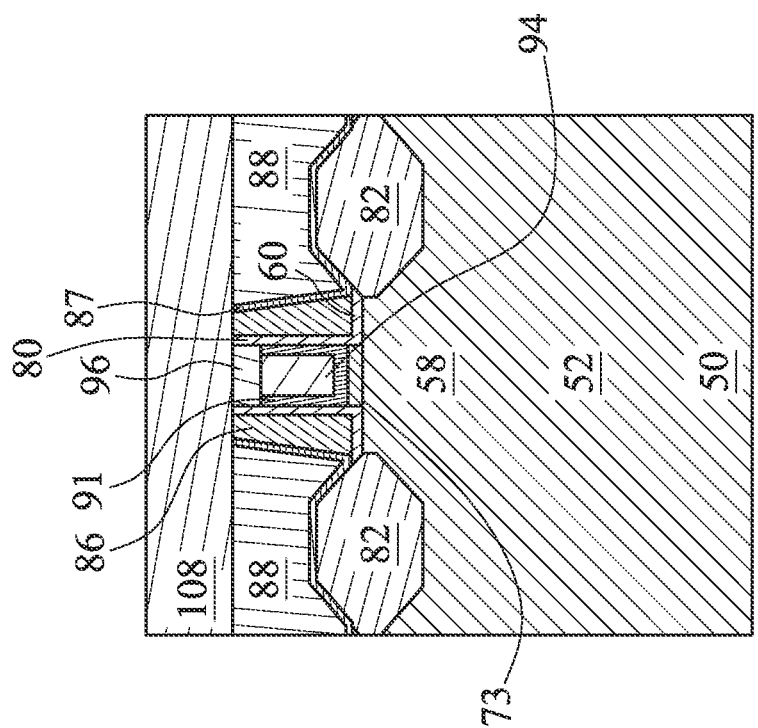
Figure 15A:
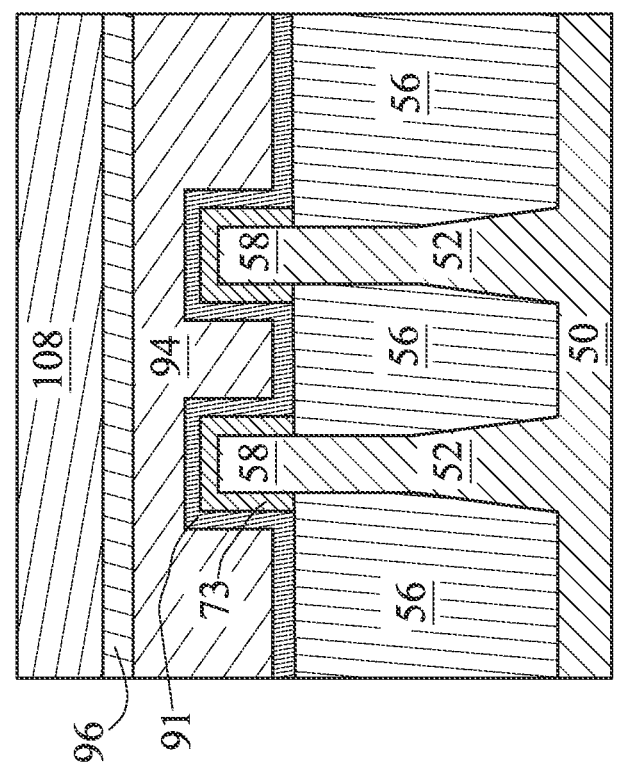

In FIGS. 15A and 15B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a ferroelectric gate dielectric layer 91 and a corresponding overlying gate electrode 94) is recessed, so that a recess is formed directly over the gate stack and between opposing portions of gate spacers 86, as illustrated in FIGS. 15A and 15B. A gate mask 96 comprising one or more layers of dielectric material, such as silicon nitride, silicon oxynitride, or the like, is filled in the recess, followed by a planarization process to remove excess portions of the dielectric material used as the material for gate mask 96 extending over the first ILD 88. The subsequently formed gate contacts 110 (FIGS. 16A and 16B) penetrate through the gate mask 96 to contact the top surface of the recessed gate electrode 94.

Figure 16A:
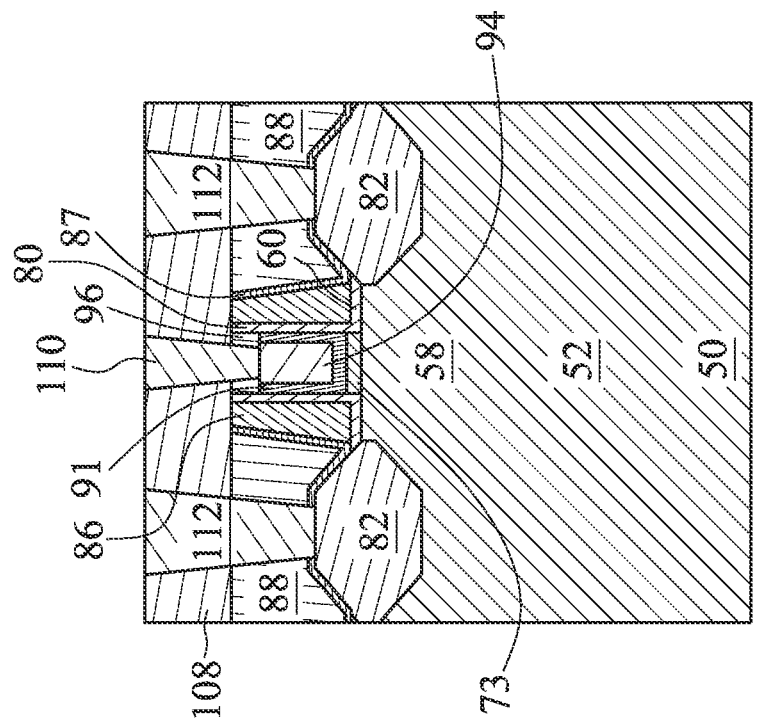
Figure 16B:
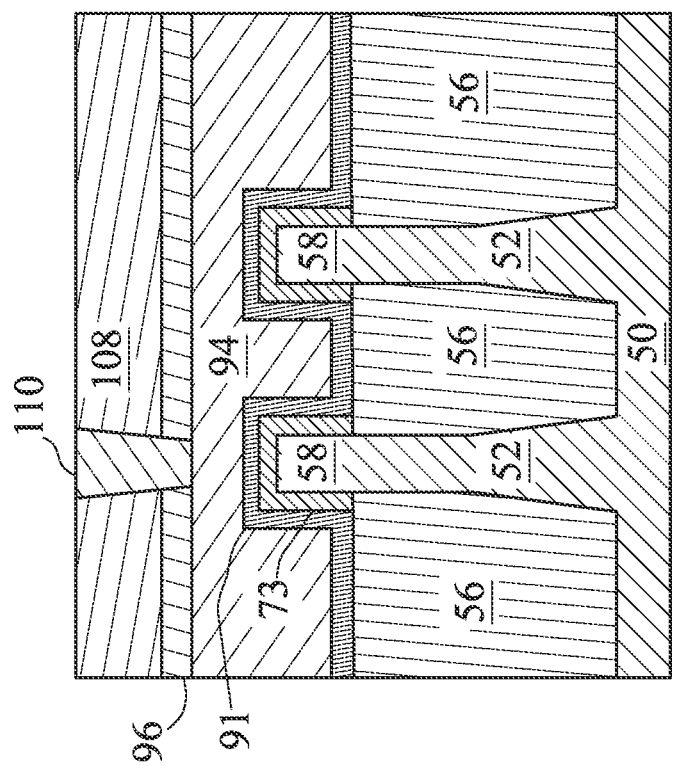

In FIGS. 16A and 16B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive fill material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive fill material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The embodiments described herein provide the advantage of fabricating NCFET devices using a ferroelectric dielectric film having adjustable ferroelectric properties (e.g., $P_R$ and $E_C$) by controlling the processing parameters a post-deposition anneal process and by including or removing a remnant dopant-source layer 79. The control over the ferroelectric properties, as described above, may provide stable, hysteresis-free NCFET FinFET devices that exhibit steep subthreshold slopes. Thereby the embodiments in this disclosure may enable FinFET CMOS integrated circuits with higher performance and lower standby power consumption.

In an embodiment, a method of forming a semiconductor device includes forming an interfacial layer on a substrate; forming a high-k dielectric layer over the interfacial layer, wherein at least a part of the high-k dielectric layer is amorphous; forming a dopant-source layer over the high-k dielectric layer; and performing a first anneal to transform the high-k dielectric layer from the high-k dielectric layer to a ferroelectric high-k dielectric layer, the ferroelectric high-k dielectric layer being polycrstalline. The embodiment further includes: after performing the first anneal, removing remaining portions of the dopant-source layer; and after removing remaining portions of the dopant-source layer, forming a conductive layer over the ferroelectric high-k dielectric layer. In an embodiment, removing remaining portions of the dopant-source layer is performed at least in part with a wet chemical process. In an embodiment, after performing the first anneal, forming a conductive layer over the ferroelectric high-k dielectric layer. In an embodiment, after forming the conductive layer remaining portions of the dopant-source layer are interposed between the conductive layer and the high-k-dielectric layer. In an embodiment, forming the dopant-source layer includes performing an atomic layer deposition process. In an embodiment, forming the dopant-source layer includes performing one or more plasma-enhanced atomic layer deposition cycles. In an embodiment, the high-k dielectric layer includes hafnium oxide. In an embodiment, the dopant-source layer includes Si, La, or Zr atoms.

In an embodiment, a method of forming a semiconductor device includes forming an interfacial layer on a substrate; forming a hafnium oxide layer over the interfacial layer, wherein at least a part of the hafnium oxide layer is amorphous; forming a dopant-source layer over the hafnium oxide layer; after forming the dopant-source layer, performing a first anneal, the first anneal diffusing dopants of the dopant-source layer into the hafnium oxide layer to form a ferroelectric high-k dielectric layer, wherein the ferroelectric high-k dielectric layer is orthorhombic-phase polycrystalline; after performing the first anneal, removing remaining portions of the dopant-source layer; and forming a conductive layer over the ferroelectric high-k dielectric layer. In an embodiment, the dopant-source layer includes Si, La, or Zr atoms. In an embodiment, the first anneal includes a spike anneal, wherein a temperature of the spike anneal is between 750° C. and 1100° C. In an embodiment, a thickness of the dopant-source layer is between 5 Å and 20 Å. In an embodiment, the dopant-source layer includes a silicon oxide, a lanthanum oxide, or a zirconia oxide. In an embodiment, wherein a thickness of the ferroelectric high-k dielectric layer has a thickness between 1 nm and 10 nm.

In an embodiment, a semiconductor device includes: a semiconductor region; a gate dielectric stack disposed over the semiconductor region, the gate dielectric stack includes: an interfacial layer disposed over the semiconductor region, the interfacial layer being non-ferroelectric; and a ferroelectric dielectric layer disposed over the interfacial layer, wherein the ferroelectric dielectric layer includes a polycrystalline material; a dopant-source layer disposed over the ferroelectric dielectric layer; and a gate electrode disposed over the dopant-source layer, the gate electrode includes a conductive layer. In an embodiment, the interfacial layer includes at least in part an oxide of a semiconductor material of the semiconductor region. In an embodiment, the ferroelectric dielectric layer includes a doped hafnium oxide in a stabilized orthorhombic phase. In an embodiment, the doped hafnium oxide is doped with Si, La, or Zr. In an embodiment, the dopant-source layer includes lanthanum oxide, silicon oxide, or zirconium oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor region;
   a gate dielectric stack disposed over the semiconductor region, the gate dielectric stack comprising:
     an interfacial layer disposed over the semiconductor region, the interfacial layer being non-ferroelectric; and
     a ferroelectric dielectric layer disposed over the interfacial layer, wherein the ferroelectric dielectric layer comprises a polycrystalline material;
   a dopant-source layer disposed over the ferroelectric dielectric layer, wherein the dopant-source layer comprises zirconium oxide;
   a gate electrode disposed over the dopant-source layer, the gate electrode comprising a conductive layer; and
   a dielectric mask in direct physical contact with a first top surface of the dopant-source layer and a second top surface of the gate electrode.

2. The semiconductor device of claim 1, wherein the interfacial layer comprises at least in part an oxide of a semiconductor material of the semiconductor region.

3. The semiconductor device of claim 1, wherein the ferroelectric dielectric layer comprises a doped hafnium oxide in a stabilized orthorhombic phase.

4. The semiconductor device of claim 3, wherein the doped hafnium oxide is doped with Zr.

5. A semiconductor device, comprising:
   an interfacial layer on a substrate;
   a ferroelectric high-k dielectric layer comprising a doped ferroelectric layer and a dopant-source layer over the doped ferroelectric layer, wherein the doped ferroelectric layer of the ferroelectric high-k dielectric layer is orthorhombic-phase polycrystalline, the ferroelectric high-k dielectric layer having a remanent polarization in a range of 0.5 $\mu C/cm^2$ to 30 $\mu C/cm^2$;
   a conductive layer over the ferroelectric high-k dielectric layer; and
   a dielectric mask having a bottom surface in direct physical contact with a top surface of the conductive layer and a top surface of the dopant-source layer of the ferroelectric high-k dielectric layer.

6. The semiconductor device of claim 5, wherein a thickness of the doped ferroelectric layer of the ferroelectric high-k dielectric layer is in a range from 1 nm to 10 nm.

7. The semiconductor device of claim 5, wherein the doped ferroelectric layer comprises hafnium oxide and dopant atoms.

8. The semiconductor device of claim 7, wherein the dopant atoms are silicon, wherein a ratio of a number of the dopant atoms to a total number of atoms in the doped ferroelectric layer of the ferroelectric high-k dielectric layer is in a range between 0.5% and 30%.

9. The semiconductor device of claim 7, wherein the dopant atoms are lanthanum, wherein a ratio of a number of the dopant atoms to a total number of atoms in the doped ferroelectric layer of the ferroelectric high-k dielectric layer is in a range between 0.5% and 50%.

10. The semiconductor device of claim 7, wherein the dopant atoms are zirconium, wherein a ratio of a number of the dopant atoms to a total number of atoms in the doped ferroelectric layer of the ferroelectric high-k dielectric layer is in a range between 5% and 80%.

11. The semiconductor device of claim 5, wherein the dopant-source layer is a silicon oxide, a lanthanum oxide, or a zirconium oxide.

12. The semiconductor device of claim 5, wherein a combined thickness of the dopant-source layer and the doped ferroelectric layer is in a range from 1 nm to 12 nm.

13. A semiconductor device comprising:
a first source/drain region and a second source/drain region, wherein a channel region is interposed between the first source/drain region and the second source/drain region; and
a gate structure over the channel region, wherein the gate structure comprises:
an interfacial layer disposed over the channel region, the interfacial layer being non-ferroelectric;
a ferroelectric dielectric layer disposed over the interfacial layer, wherein the ferroelectric dielectric layer comprises a polycrystalline material doped with zirconium and has a remanent polarization in a range of 0.5 $\mu C/cm^2$ to 30 $\mu C/cm^2$;
a dopant-source layer disposed over the ferroelectric dielectric layer, wherein the dopant-source layer comprises zirconium oxide;
a gate electrode over the dopant-source layer; and
a dielectric mask, wherein a bottom surface of the dielectric mask is in direct physical contact with both a first top surface of the dopant-source layer and a second top surface of the gate electrode.

14. The semiconductor device of claim 13, wherein a combined thickness of the dopant-source layer and the ferroelectric dielectric layer is in a range from 1 nm to 12 nm.

15. The semiconductor device of claim 14, wherein the ferroelectric dielectric layer comprises a doped hafnium oxide in a stabilized orthorhombic phase.

16. The semiconductor device of claim 1, wherein the ferroelectric dielectric layer has a remanent polarization in a range between 0.5 $\mu C/cm^2$ to 30 $\mu C/cm^2$.

17. The semiconductor device of claim 13, wherein the zirconium doped in the ferroelectric dielectric layer comprises 5% to 80% of the ferroelectric dielectric layer.

18. The semiconductor device of claim 5, wherein the conductive layer is part of a gate electrode.

19. The semiconductor device of claim 5, wherein the dopant-source layer has a thickness of at least 2 nm.

20. The semiconductor device of claim 13, wherein a thickness of the ferroelectric dielectric layer is in a range from 1 nm to 10 nm.

* * * * *